United States Patent
Takeuchi

[19]

[11] Patent Number: 5,824,119
[45] Date of Patent: Oct. 20, 1998

[54] PROCESS FOR IMMERSING A SUBSTRATE IN A PLURALITY OF PROCESSING BATHS

[75] Inventor: Mitsuo Takeuchi, Kawasaki, Japan

[73] Assignee: Fujitsu Limited, Kaswasaki, Japan

[21] Appl. No.: 539,202

[22] Filed: Oct. 4, 1995

[30] Foreign Application Priority Data

Jan. 9, 1995 [JP] Japan ..................................... 7-001388

[51] Int. Cl.$^6$ .............................. B08B 3/00; B44C 1/22; C03C 15/00; C03C 25/06
[52] U.S. Cl. ................................ 29/25.01; 134/28; 216/91
[58] Field of Search .................... 29/25.01; 211/41.18; 206/711, 454, 833; 216/83, 90, 91; 134/26, 28; 156/345

[56] References Cited

U.S. PATENT DOCUMENTS 3,766,046 10/1973 Flint .
4,555,216 11/1985 Buschor .
5,704,493 1/1998 Fujikawa et al. .
5,730,162 3/1998 Shindo .

FOREIGN PATENT DOCUMENTS 63-119240 5/1988 Japan .

Primary Examiner—David Graybill
Attorney, Agent, or Firm—Armstrong, Westerman, Hattori, McLeland & Naughton

[57] ABSTRACT

In the substrate processing method in which substrates are immersed in processing baths holding chemicals and pure water for processing, when a substrate carrier is moved from a first processing bath to a second processing bath, the substrate carrier is moved to a second processing bath with a chemical or pure water from the first processing bath held in the substrate carrier. In subjecting substrates to chemical processing and water rinse, the substrates in the substrate carrier are carried to a next processing bath with the chemical or pure water in the first processing bath held in the substrate carrier.

12 Claims, 18 Drawing Sheets

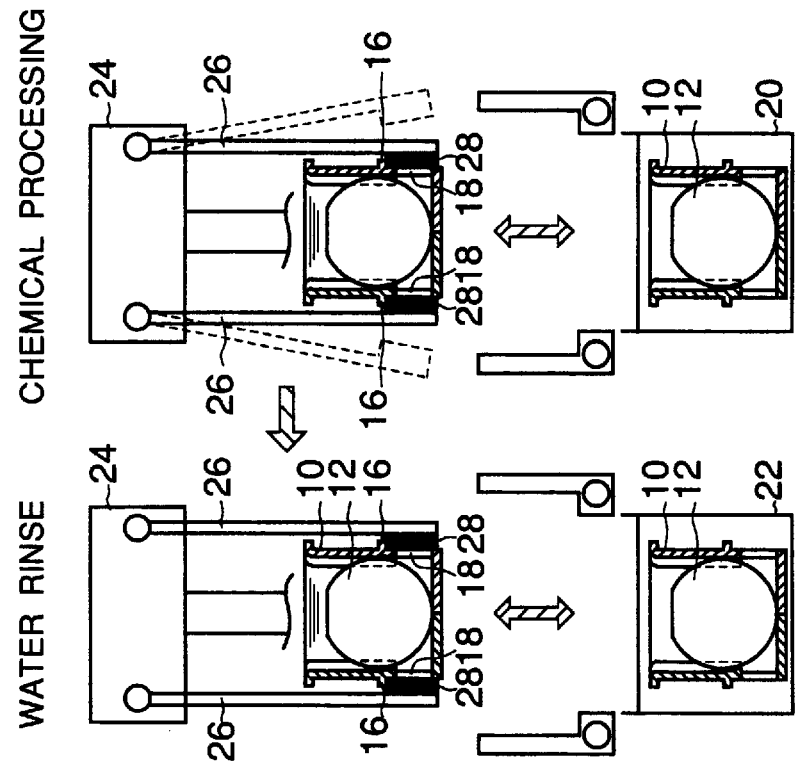
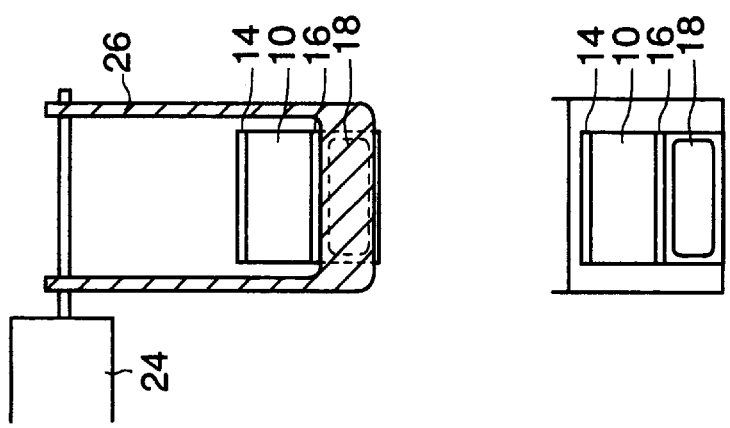

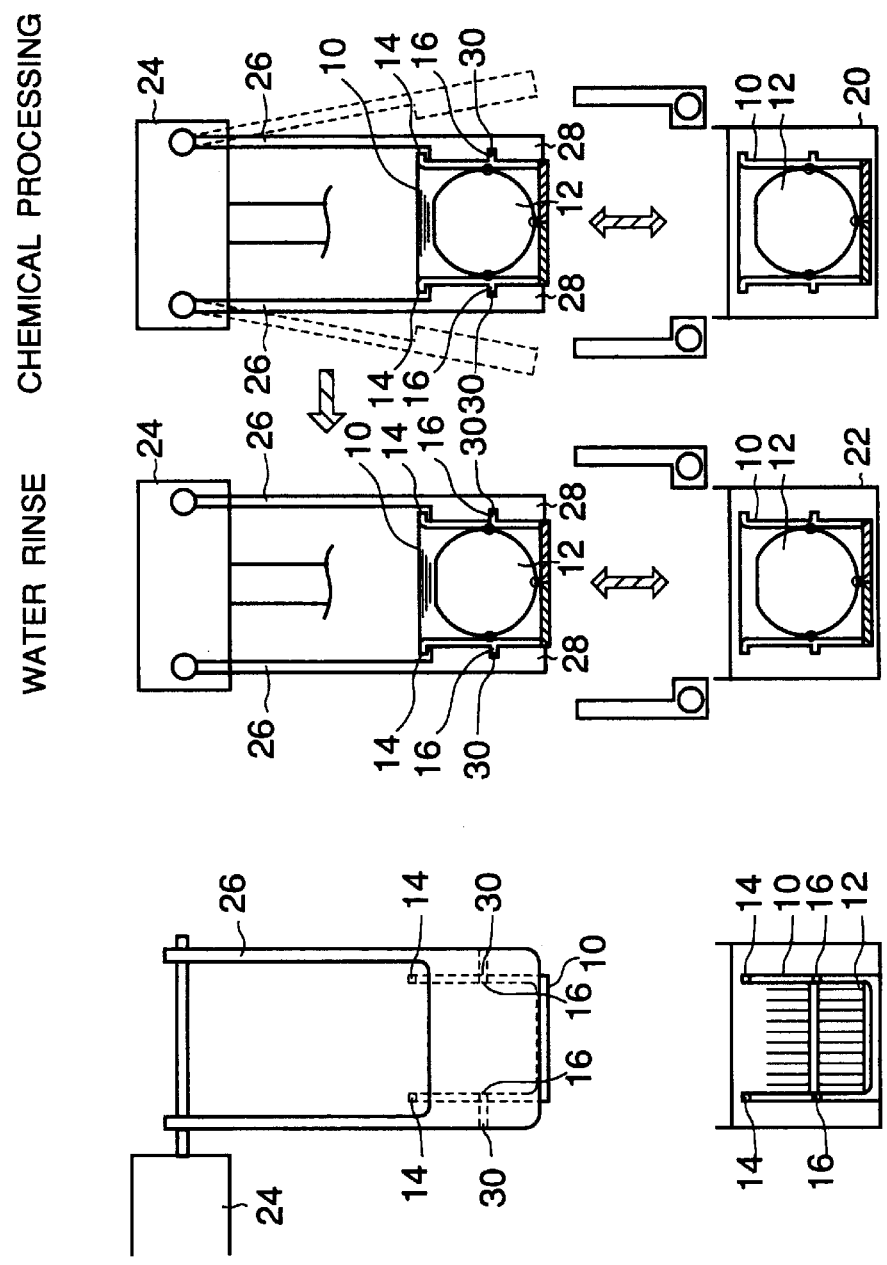

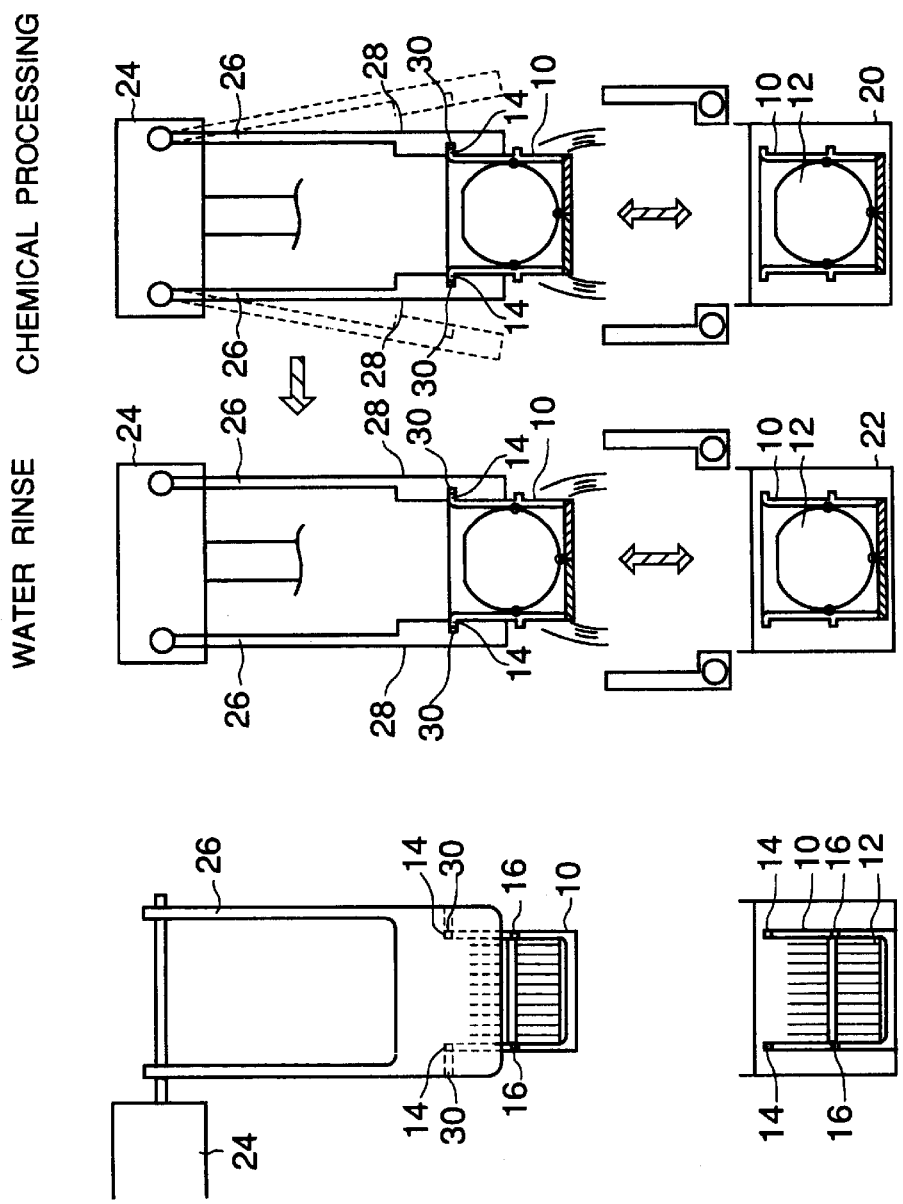

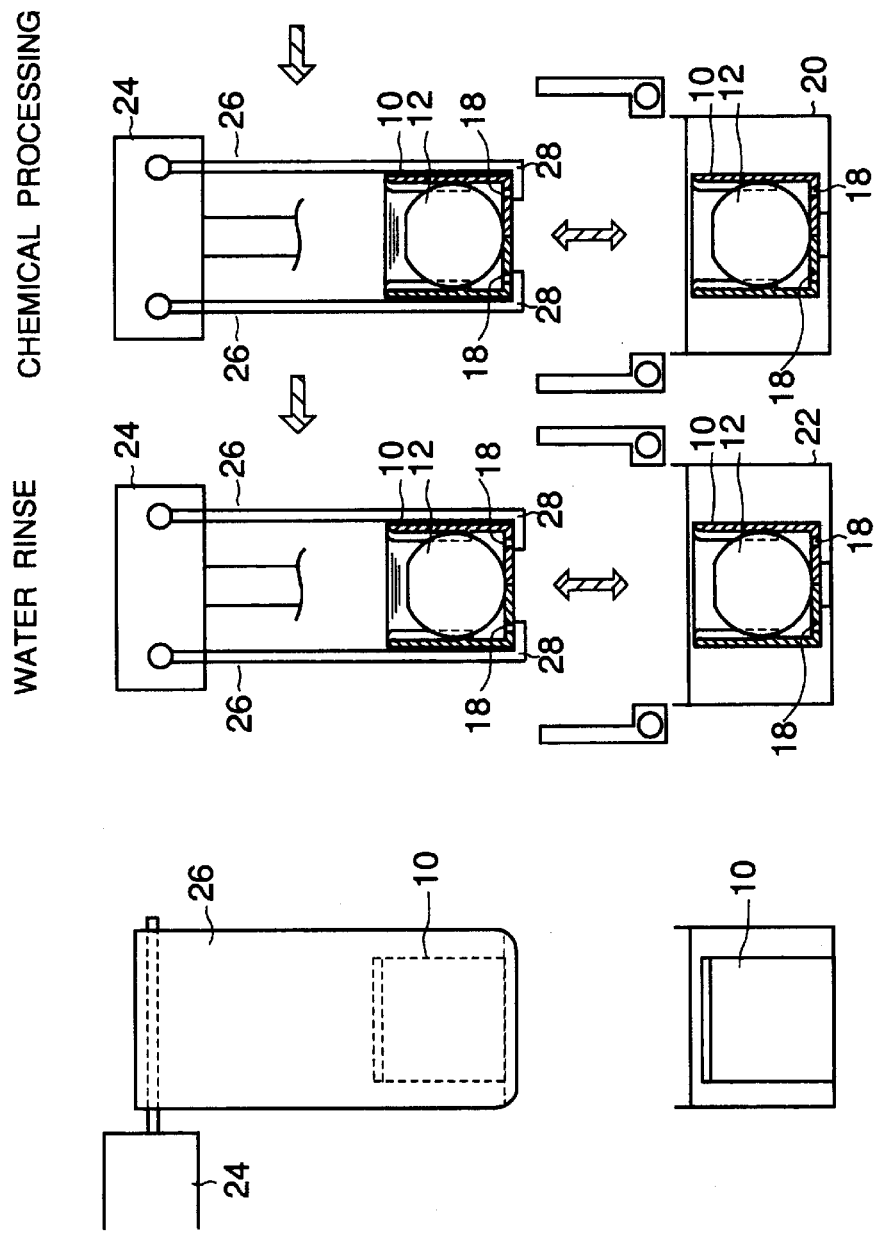

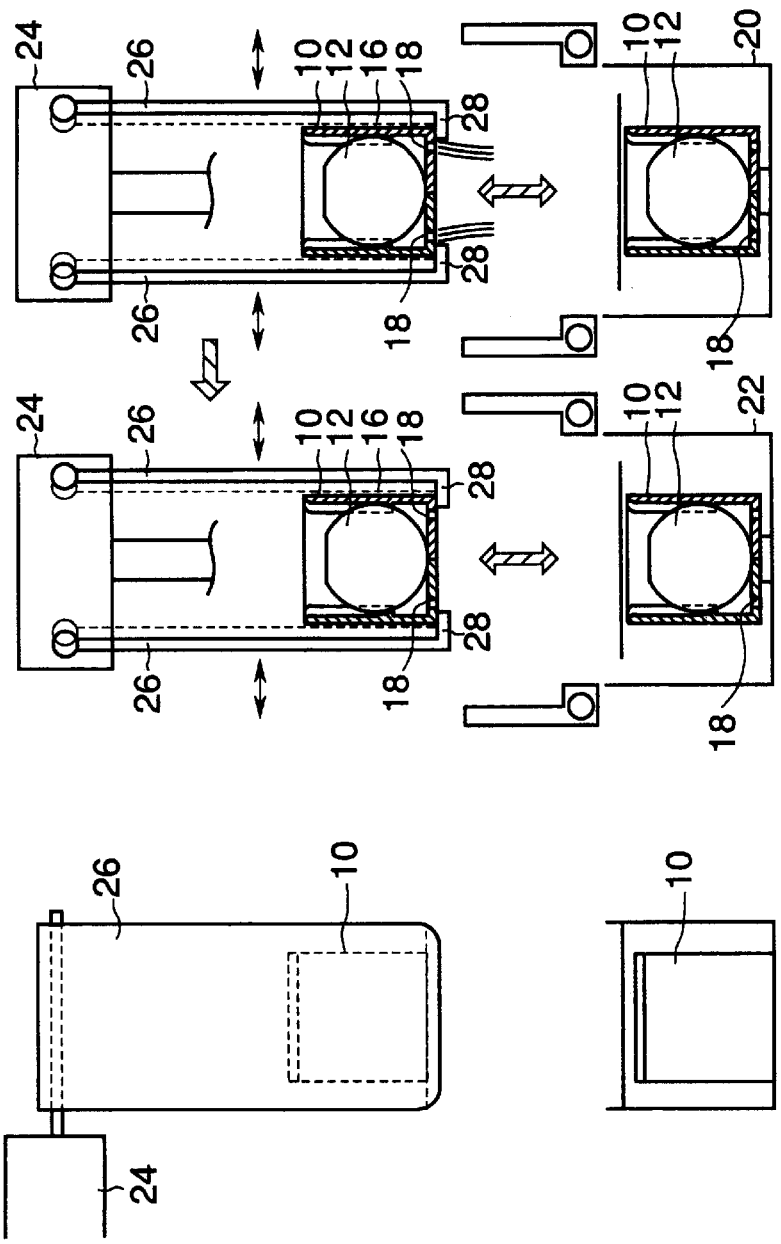

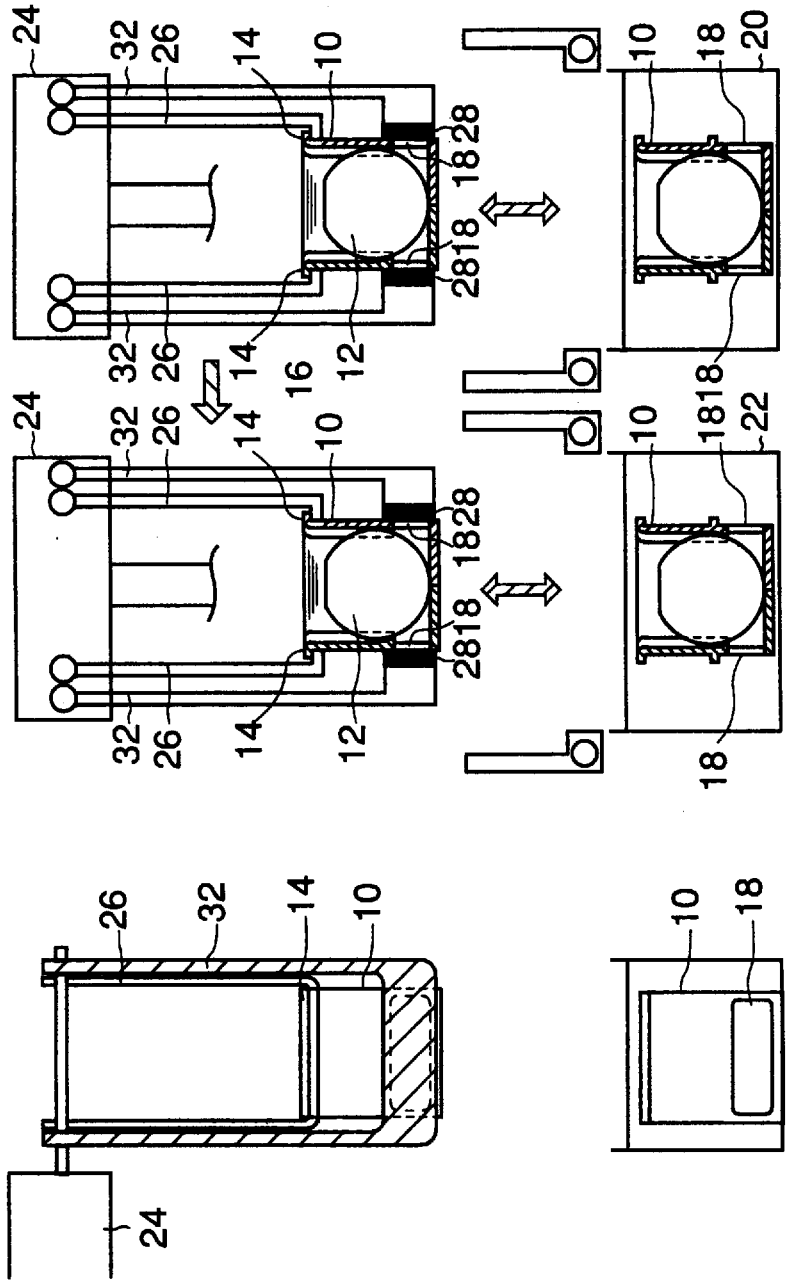

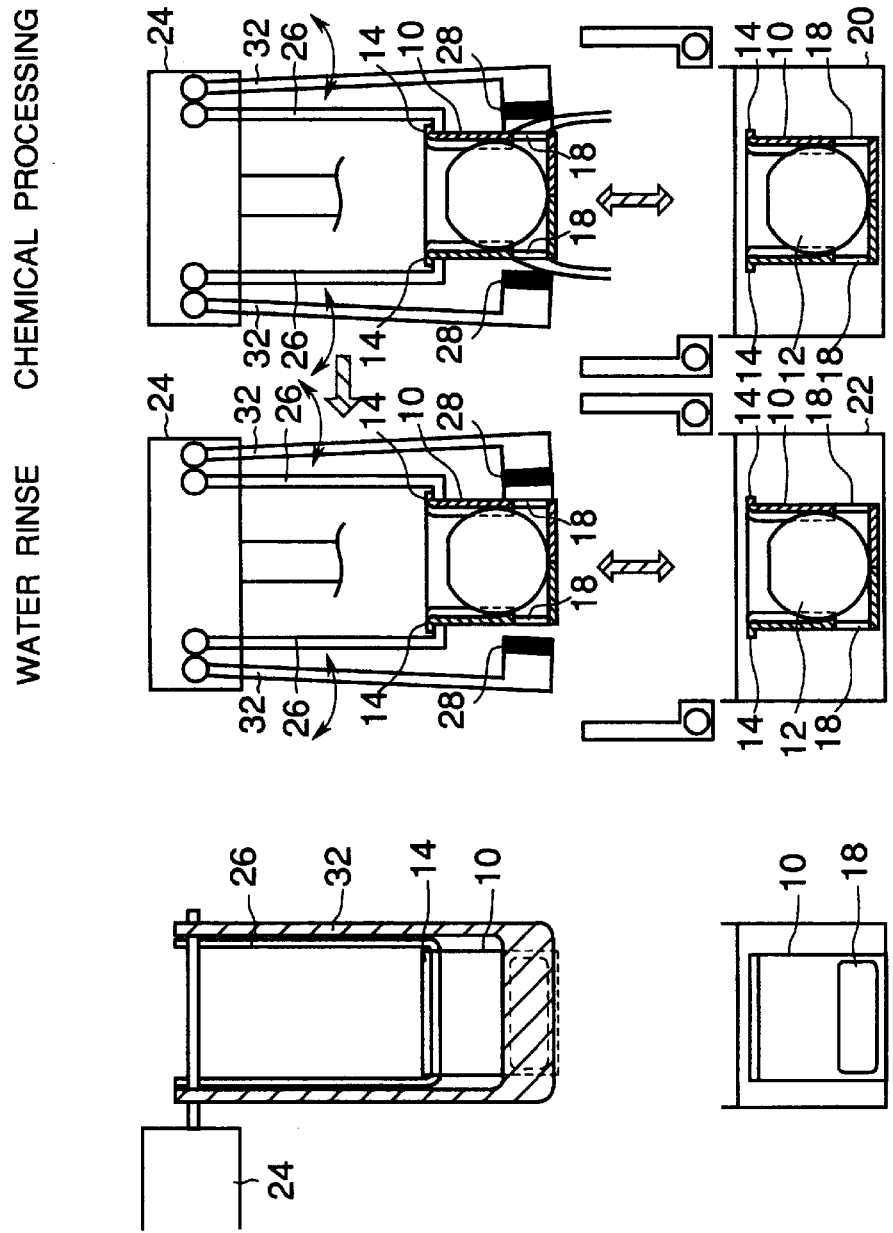

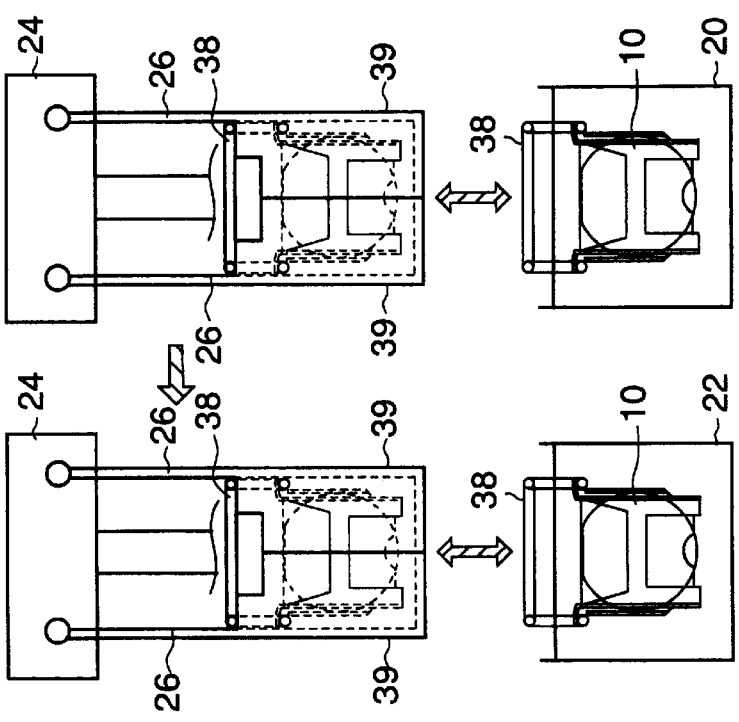
FIG. 14A CHEMICAL PROCESSING
FIG. 14B WATER RINSE
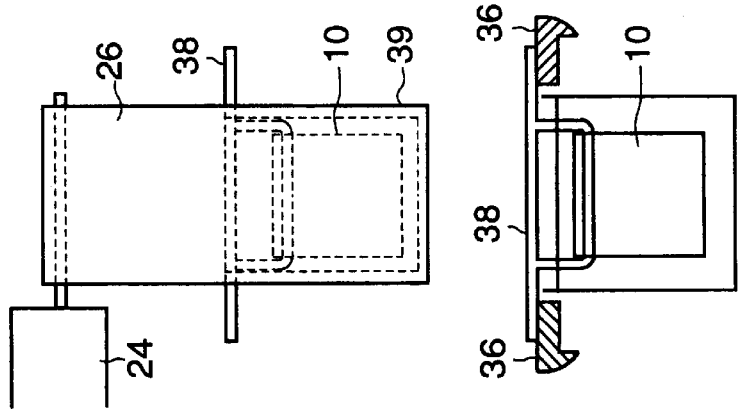
FIG. 14C

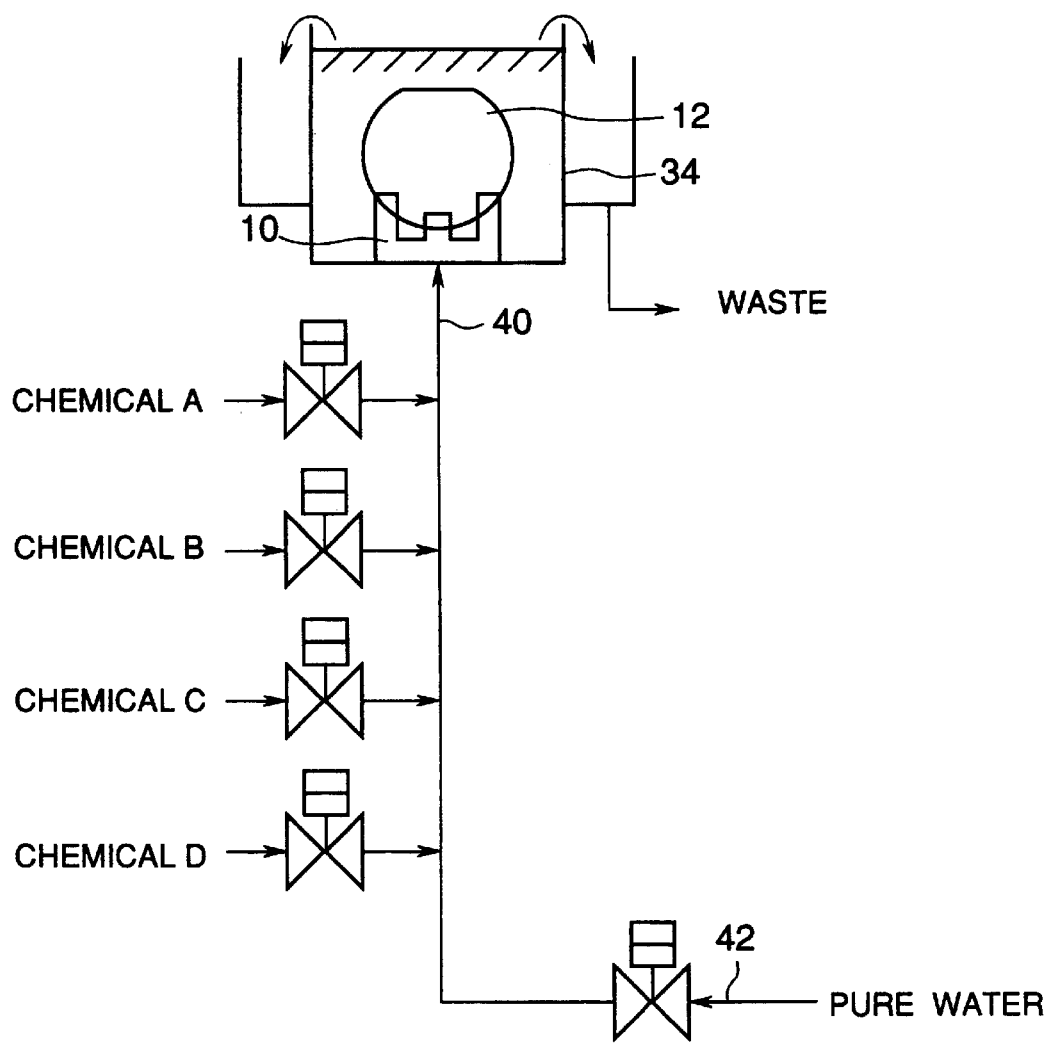

PROCESS FOR IMMERSING A SUBSTRATE IN A PLURALITY OF PROCESSING BATHS

BACKGROUND OF THE INVENTION

The present invention relates to a substrate processing method and apparatus for subjecting various substrates to be used in fabrication processes of semiconductor devices, etc. to chemical treatments and cleaning, and a substrate carrier for use in the substrate processing method and apparatus.

Dust particles in clean rooms, dust particles generated in various fabrication steps adhere to reticles, wafers, etc. This is one cause for lowering product yields.

Especially in fabrication processes of semiconductor devices, accompanying the recent high integration of semiconductor devices, micron-order dust particles affect yields of products.

Various causes for particles adhering to substrates are considered. One of the causes is considered to be that removed particles re-adhere back to substrates in chemical treatment steps and cleaning steps.

A process of particles adhering to substrates will be explained by the use of the conventional multibath processing apparatus as an example.

As shown in FIG. 16, the conventional multibath processing apparatus includes a plurality of processing baths 34 filled with chemicals or pure water for processing substrates 12. A carrier robot 24 is provided above the processing baths 34 for carrying a substrate carrier 10 for holding the substrates 12 to the respective processing baths 34. The carrier robot 24 has arms 26 which grip the substrate carrier 10. The carrier robot 24 has a lift mechanism (not shown) which raises and lowers the carrier robot 24 to place it in and lift it out of the processing baths.

Here, on the assumption that a processing bath 34b is a chemical bath filled with a hydrogen fluoride (HF) aqueous solution, and a processing bath 34c is a water bath filled with pure water, a case that substrates 12 to be processed are processed with a HF aqueous solution will be explained.

First the substrates 12 to be processed are held in the substrate carrier 10. The substrate carrier 10 is gripped by the arms 26 and carried by the carrier robot 24.

The substrate carrier 10 is carried to above the processing bath 34b and lowered by the lift mechanism to immerse the substrate carrier 10 gripped by the arms 26 into the HF aqueous solution in the processing bath 34b. When the substrate carrier 10 is immersed in the HF aqueous solution, the arms 26 are removed from the substrate carrier 10, and the carrier robot 24 is lifted by the lift mechanism to lift the arms 26. In this state, the substrates 12 are subjected to chemical processing for a prescribed period of time.

When the chemical processing is over, the carrier robot 24 is again lowered by the lift mechanism to lower the arms 26, and the substrate carrier 10 is gripped by the arms 26. Then the carrier robot 24 is lifted by the lift mechanism to lift the arms 26 to lift the substrate carrier 10 out of the processing bath 34b.

Next, the substrate carrier 10 is carried by the carrier robot 24 to above the processing bath 34c, and as in immersing the substrate carrier into the HF aqueous solution, the carrier robot 24 is lowered by the lift mechanism to lower the substrate carrier 10 gripped by the arms 26 and immerses the substrate carrier 10 into the pure water in the processing bath 34c. When the substrate carrier 10 is placed in the processing bath 34c, the arms 26 are removed from the substrate carrier 12, and the carrier robot 24 is lifted by the lift mechanism to lift the arms 26. In this state, water rinse is conducted for a prescribed period of time.

When the water rinse is over, the carrier robot 24 is again lifted by the lift mechanism to lower the arms 26 to grip the substrate carrier 10 by the arms 26. Then, the carrier robot 24 is lifted by the lift mechanism to lift the arms 26, and the substrate carrier 10 is taken out of the processing bath 34c.

Subsequently, the substrate carrier 10 is carried by the carrier robot 24 sequentially to an alcohol bath (not shown) and to a warm air drying vessel (not shown) to dry the substrates. Thus a line of processing is finished.

It is usual that circulatory filtration is performed in the processing baths 34 lest dust carried in by the substrates 12 from the outside and dust particles caused by the chemical processing, etc., reside in the processing baths and again adhere to the substrates 12. To this end, chemicals in the processing baths 34 are caused to overflow the processing baths, and overflow of the chemicals are filtered to remove dust contained therein and returned to the processing baths 34.

Even by the use of such circulatory filtration, it is difficult to circulate the chemicals in the processing bath without stagnation and with total elimination of all dust on the surfaces of the chemicals. Especially in the vicinities of the centers of the chemical surfaces, the chemicals do not sufficiently circulate, and dust tends to stagnate there.

On the other hand, it is generally known that when the substrates are lifted out of the chemicals, friction between the chemicals and the surfaces of the substrates 12 causes static electricity on the surfaces of the substrates 12. Because of this static electricity, dust on the interface of the chemical surfaces and the air, i.e., the gas-liquid interfaces, tends to be attracted onto the surfaces of the substrates 12. This static electricity increases with increases of lift speed of the substrates 12.

In this substrate processing method, as shown in FIG. 17A, when the substrate 12 is lifted out of the processing bath 20 of a chemical, the substrate 12 passes through the gas-liquid interface, and at this time particles adhere to the substrate surfaces.

FIG. 17B shows the state of particles adhering to the substrate 12 which was paused at the gas-liquid interface when the substrate 12 was lifted out of the chemical processing bath 20. As shown, a linear region of higher particle densities is present on the surface of the substrate 12. This region corresponds to the part of the substrate 12 which contacted the gas-liquid interface when the substrate 12 was paused while being lifted. This shows that particles tend to adhere at the gas-liquid interface.

To prevent such adhesion of particle at the gas-liquid interface, a single bath processing apparatus is proposed.

As shown in FIG. 18, the single bath processing apparatus includes a plurality of chemical feed pipes and a pure water feed pipe connected to a processing bath 34 for chemical processing and water rinse. In the single processing bath, a plurality of chemical processes and water rinses can be continuously conducted.

Next, a process method by the single bath processing apparatus will be explained below.

Substrates 12 to be processed are held in a substrate carrier 10, and the substrate carrier 10 is placed in a processing bath 34. Then, a required chemical, e.g., a chemical A, is fed through a chemical feed pipe 40, and chemical processing is conducted on the substrates.

When the processing with chemical A is over, chemical A is not discharged out of the processing bath 34, and pure water is fed into the processing bath 34 at the bottom thereof through the pure water feed pipe 42 to cause the chemical A in the processing bath 34 to overflow the processing bath 34. The chemical A in the processing bath 34 is replaced by the pure water for water rinse of the substrates 12.

When processing with, e.g., a chemical B, immediately following the water rinse, the feed of the pure water is stopped, and the chemical B is fed into the processing bath 34 at the bottom thereof through a chemical feed pipe 40 to cause the pure water in the processing bath 34 to overflow the processing bath 34. The pure water in the processing bath 34 is thus replaced by the chemical B for continuous chemical processing.

After prescribed chemical processes are conducted, the substrates 12 are water rinsed in the above-described procedure, and moved next to a drying vessel (not shown) and dried there. A line of processing is thus completed.

In the single bath processing apparatus, chemical processing and water rinse can be thus continuously conducted on the substrates 12 kept immersed in solutions throughout a line of the processing. The substrates 12 do not contact the gas-liquid interfaces until the final water rinse is over. Adhesion of particles to the substrates due to their contact with the gas-liquid interfaces can be largely reduced.

A line of processing is conducted in the same processing bath. Times of transferring the substrates 12 are accordingly reduced, and dust caused by the transfer of the substrates 12 is accordingly reduced.

The substrates do not contact air during a line of processing. Growth of native oxide films can be inhibited.

Owing to these advantages, in comparison with the conventional multibath processing apparatus, the single bath processing apparatus can reduce the number of particles adhering to the substrates by about 90%.

The above-described conventional single bath processing apparatus, in which all processing of one line is conducted in one bath, has a problem that throughputs are greatly lowered in comparison with the multibath processing apparatus. That is, in the multibath processing apparatus, when processing is over on substrates in a first processing bath, the substrates are transferred to a second processing bath, and another lot can be processed in the first processing bath. In the single bath processing apparatus, unless the current process is all over, the next lot cannot be processed. In a typical example, a processing time for one lot was about 10 minutes for the multibath processing apparatus and about 60 minutes for the single bath processing apparatus.

For the single bath processing apparatus to obtain a throughput equivalent to that of the multibath processing apparatus, multistages of the single bath processing apparatuses are provided. The single bath processing apparatus needs a complicated control mechanism, etc., which makes the apparatus expensive. To obtain the same throughput as the multibath processing apparatus, an equipment cost which is about 3 times that of the multibath processing apparatus must be invested.

To replace a liquid in the processing bath, the liquid is discharged only by overflowing. The structure of the interior of the processing bath must be simple without projections. This is because the efficiency of replacing a chemical by pure water is improved. Complicated interior structures take time for a chemical and pure water held in the processing bath to overflow the processing bath, and the throughputs are further deteriorated. Accordingly this makes it difficult to provide a heater in the processing bath, which makes the single bath processing apparatus inapplicable to chemicals which require temperature control.

In replacing a chemical in the processing bath with pure water, the chemical and the pure water are directly mixed with each other. Chemicals, e.g., sulfuric acid, which are highly reactive with water cannot be used.

Even a chemical whose reactivity with water is low is difficult to replace with pure water when the chemical has high concentrations. This is not desirable in terms of throughputs.

Furthermore, a chemical which has been used in processing substrates is replaced by pure water to be discharged. It is impossible to re-use the chemical. One processing bath of a chemical is consumed for one-lot processing. This is not suitable for mass production.

SUMMARY OF THE INVENTION

An object of the present invention is to provide a substrate processing method and apparatus which can process substrates with chemicals and water rinse the substrates without contacting the substrates with the gas-liquid interfaces, can retain throughputs comparable with those of the multibath processing apparatus, and can reduce the amount of chemicals used, and to provide a substrate carrier for use in the processing method and apparatus.

The above-described object is achieved by a substrate processing method for immersing a substrate in a plurality of processing baths which are filled respectively with chemicals or pure water to subject the substrate to chemical processing and water rinse, such that when a substrate carrier for holding the substrate is moved from a first one of the processing baths to a second one of the processing baths, the substrate carrier is moved to the second processing bath with a chemical or pure water from the first processing bath held in the substrate carrier.

The above-described object is also achieved by a substrate processing method comprising: a first substrate processing step of immersing a substrate carrier holding substrate to be processed into a first processing liquid filling a first processing bath and processing the substrate; a substrate carrier moving step of moving the substrate carrier to a second processing bath filled with a second processing liquid with the first processing liquid held in the substrate carrier; and, a second substrate processing step of immersing the substrate carrier with the first processing liquid held therein into the second processing liquid in the second processing bath, replacing the first processing liquid in the substrate carrier with the second processing liquid, and processing the substrate with the second processing liquid.

In the above-described substrate processing method, it is preferable that when the substrate carrier is moved, the substrate carrier is held by arms with openings formed in the substrate carrier closed thereby.

In the above-described substrate processing method, it is preferable that when the substrate carrier is moved, the substrate carrier is held by arms with openings formed in the substrate carrier closed thereby.

In the above-described substrate processing method, it is preferable that the substrate carrier is accommodated in a box-shaped space defined by arms for holding the substrate carrier, and is moved with the chemical or pure water held in the box-shaped space.

In the above-described substrate processing method, it is preferable that the substrate carrier is accommodated in a box-shaped space defined by arms for holding the substrate carrier, and is moved with the chemical or pure water held in the box-shaped space.

The above-described object is also achieved by a substrate processing apparatus comprising: a plurality of processing baths in which a substrate is processed with chemicals or pure water; a substrate carrier for holding the substrate to be subjected to chemical processing or water rinse; and, arms for holding the substrate carrier with the substrate immersed in the chemicals and the pure water when the substrate carrier is moved among said plurality of processing baths.

In the above-described substrate processing apparatus, it is preferable that the substrate carrier has openings in sidewalls thereof or in a bottom surface thereof, and, the arms have holding portions for closing the openings.

In the above-described substrate processing apparatus, it is preferable that the arms have holding portions for holding the substrate carrier therein when the arms carry the substrate carrier.

In the above-described substrate processing apparatus, it is preferable that the substrate carrier includes: a box-shaped container for holding the substrate; first holding means provided on upper parts of opposed sidewalls of the box-shaped container; second holding means provided on middle parts of the sidewalls on which the first holding means are provided; and, openings formed in parts of the sidewalls with the first and second holding means thereon provided, which are below the second holding means, and, the arms include: holding portions which are larger than the openings and which hold the first or the second holding means.

In the above-described substrate processing apparatus, it is preferable that the substrate carrier includes: a box-shaped container for holding the substrate; first holding means provided on upper parts of opposed sidewalls of the box-shaped container; second holding means provided on middle parts of the sidewalls on which the first holding means are provided; and, openings formed in substantially the entire sidewalls with the first and second holding means thereon provided, and, the arms includes: holding portions which are larger than the openings and which hold the first or the second holding means; and, grooves formed in the holding portions and being brought into engagement with the first or the second holding means when the arms hold the first or the second holding means.

In the above-described substrate processing apparatus, it is preferable that the substrate carrier includes: a box-shaped container for holding the substrate; and, an opening formed in the bottom surface of the box-shaped container, and, the arms includes: holding portions which close the opening in the substrate carrier.

In the above-described substrate processing apparatus, it is preferable that the substrate carrier includes: a box-shaped container for holding the substrate; holding means provided on upper parts of opposed sidewalls of the box-shaped container; and, openings formed in lower parts of the sidewalls with the holding means thereon formed, and, the substrate processing apparatus further comprises closure arms which close the openings when the substrate carrier is moved.

The above-described object is also achieved by a substrate processing method using a substrate processing apparatus which comprises substrate carrier which has openings, for holding a substrate, and arms for holding and moving the substrate carrier, the substrate processing method comprising: a substrate immersing step of immersing the substrate in the substrate carrier into a chemical or pure water filling a first processing bath; a substrate carrier lifting step of lifting the substrate carrier out of the first processing bath by the arms with the openings closed thereby when the substrate is moved while being immersed in the chemical or pure water; or lifting the substrate carrier out of the first processing bath by the arms with the openings not entirely closed or opened when the substrate is moved with the chemical or the pure water in the substrate carrier being discharged; and, a substrate carrier moving step of moving the substrate carrier to a second processing bath by the arms.

In the above-described substrate processing method, it is preferable that the substrate carrier includes the openings, first holding means, and second holding means, formed in sidewalls thereof; when the substrate is moved while being immersed in the chemical or the pure water, the second holding means are held by the arms with the openings closed thereby, and the substrate carrier is lifted out of the first processing bath; when the substrate is moved with the chemical or the pure water in the substrate carrier being discharged, the first holding means are held by the arms with the openings opened, and the substrate carrier is lifted out of the first processing bath.

In the above-described substrate processing method, it is preferable that the substrate carrier includes the openings, first holding means, and second holding means, formed in sidewalls thereof; the arms includes holding portions engaged with the first holding means or second holding means; when the substrate is moved while being immersed in the chemical or the pure water, the second holding means are engaged with the holding portions with the openings closed thereby, and the substrate carrier is lifted out of the first processing bath; when the substrate is moved with the chemical or the pure water in the substrate carrier being discharged, the first holding means are engaged with the holding portions with the openings not entirely closed or opened, and the substrate carrier is lifted out of the first processing bath.

In the above-described substrate processing method, it is preferable that the substrate carrier includes the openings formed in a bottom surface thereof; when the substrate is moved while being immersed in the chemical or the pure water, the bottom of the substrate carrier is held by the arms with the openings closed thereby, and the substrate carrier is lifted out of the first processing bath; when the substrate is moved with the chemical or the pure water in the substrate carrier being discharged, the bottom of the substrate carrier is held by the arms with the openings not entirely closed thereby, and the substrate carrier is lifted out of the first processing bath.

In the above-described substrate processing method, it is preferable that the arms includes first arms which hold and move the substrate carrier, and second arms which close the openings of the substrate carrier; when the substrate is moved while being immersed in the chemical or the pure water, the substrate carrier is held by the first arms and the openings are closed by the second arms, and the substrate carrier is lifted out of the first processing bath; when the substrate is moved with the chemical or the pure water in the substrate carrier being discharged, the substrate carrier is held by the first arms and the openings are not closed by the second arms, and the substrate carrier is lifted out of the first processing bath.

The above-described object is also achieved by a substrate processing method, using a substrate processing apparatus which comprises a substrate carrier which has openings, for holding a substrate, and arms having holding portions for holding the substrate carrier therein, the substrate processing method comprising: a first substrate immersing step of immersing the substrate in the substrate carrier into a chemical or pure water filling a first processing bath; a substrate carrier lifting step of holding the substrate carrier so that the holding portions define a space, and the substrate carrier is held in the space, and lifting the substrate carrier out of the first processing bath, when the substrate is moved while being immersed in the chemical or pure water; or holding the substrate carrier so that the space is defined by the holding portions with a gap therebetween, and the substrate carrier is held in the space, and lifting the substrate carrier out of the first processing bath, when the substrate is moved with the chemical or the pure water in the substrate carrier being discharged; and, a substrate carrier moving step of moving the substrate carrier to a second processing bath by the arms.

The above-described object is also achieved by a substrate carrier comprising: a box-shaped container for holding substrate; first holding means provided on upper parts of opposed sidewalls of the box-shaped container; second holding means provided at middle parts of the sidewalls with the first holding means thereon provided; and, openings formed in lower parts of the sidewalls with the first and the second holding means thereon provided, which are below the second holding means.

The above-described object is also achieved by a substrate carrier comprising: a box-shaped container for holding substrate; first holding means provided on upper parts of opposed sidewalls of the box-shaped container; second holding means provided at middle parts of the sidewalls with the first holding means thereon provided; and, openings formed in substantially the entire sidewalls with the first and the second holding means thereon provided.

The above-described object is also achieved by a substrate carrier comprising: a box-shaped container for holding substrate; and, openings formed in a bottom of the box-shaped container.

The above-described object is also achieved by a substrate carrier comprising: a box-shaped container for holding substrate; holding means provided on upper parts of opposed sidewalls of the box-shaped container; and, openings formed in lower parts of the sidewalls with the holding means thereon provided.

According to the present invention, in subjecting substrates to chemical processing and water rinse in a multibath processing apparatus, the substrate carrier is moved from one processing bath to another processing bath with a chemical used in the processing in the former processing bath held in the substrate carrier. The substrates do not contact the gas-liquid interfaces in a line of processing steps, and particle adhesion can be reduced to the same level as that in the single bath processing apparatus.

It is not necessary that a chemical in the processing bath be replaced by another chemical as in the conventional single bath processing apparatus. The amount of chemical consumed for one chemical processing can be reduced to below half that in the single bath processing apparatus.

Processing baths of the conventional multibath processing apparatus can be used as they are. The baths can have shapes suitable for respective chemical processing and water rinse.

Products can be continuously processed. In comparison with the single bath processing apparatus, higher throughputs can be obtained.

When the substrate carrier is moved, the openings in the substrate carrier are closed by the arms holding the substrate carrier, whereby the substrate carrier can be moved with a chemical in a processing bath held in the substrate carrier.

The substrate carrier is moved, held by the arms and accommodated in a box-shaped space defined by the arms with a chemical held in the space. Commercially available substrate carriers can be used for the substrate processing.

A multibath processing apparatus includes a plurality of processing baths for processing substrates with chemicals and pure water, a substrate carrier for holding substrates, and arms for holding the substrates, immersed in the chemicals, whereby the apparatus can reduce adhesion of particles.

Openings are formed in sidewalls or in the bottom of the substrate carrier. The openings in the substrate carrier are closed by the arms when the substrate carrier is moved, held the arms among the processing baths, whereby the substrate carrier can be moved with chemicals held therein.

The arms are arranged to define a box-shaped space when the arms hold the substrate carrier, and the substrate carrier is accommodated in the space and moved with chemicals held in the space, whereby the substrate processing apparatus can use commercially available substrate carrier.

This substrate processing apparatus can use a substrate carrier comprising a box-shaped container, first holding means provided on upper parts of opposed sidewalls of the box-shaped container, second holding means provided on middle parts of the sidewalls with the first holding means thereon provided, openings formed in parts of the side walls with the first and the second holding means which are below the second holding means; and arms having holding portions larger than the openings in the substrate carrier.

This substrate processing apparatus can use a substrate carrier comprising a box-shaped container, first holding means provided on upper parts of opposed sidewalls of the box-shaped container, second holding means provided at middle parts of the sidewalls with the first holding means thereon provided, and openings formed in the substantially entire sidewalls with the first and the second holding means thereon provided; and arms including holding portions which have grooves for receiving the first or the second holding means when the arms hold the first or the second holding means, and which are larger than the openings.

This substrate processing apparatus can use a substrate carrier comprising a box-shaped container, and openings formed in the bottom of the box-shaped container; and arms having holding portions which close the openings in the bottom of the substrate carrier.

This substrate processing apparatus further comprises closure arms which close openings formed in a substrate carrier when the substrate carrier is moved, whereby the substrate carrier comprises a box-shaped container, holding means provided on upper parts of oppose sidewalls of the box-shaped container, and the openings formed in lower parts of the sidewalls with the holding means thereon provided is applied.

The arms are operated so that the holding portions define a box-shaped space, and the substrate carrier is held in the space when the substrate carrier is moved, immersed in a processing liquid or pure water and moving the substrate carrier to a second processing bath holding a second processing liquid; and, the arms are operated so that the space is defined by the holding portions with a gap therebetween, and the substrate carrier is held in the space when the processing liquid or the pure water discharged and moving the substrate carrier to the second processing bath holding the second processing liquid. Thus the substrate carrier is moved to a second processing bath holding a second processing liquid. Processing without exposing the substrates to the gas-liquid interfaces, and processing using chemicals, etc., which are highly reactive with water can be switched therebetween via the thus simple operation of the arms.

The substrate carrier is lifted out of a processing bath with the second holding means held by the holding portions and the openings closed by the holding portions when the substrate carrier is moved with a processing liquid or pure water filled therein; and the substrate carrier is lifted out of the processing bath with the first holding means held by the holding portions when the substrate carrier is moved with the processing liquid or the pure water discharged. Processing without exposing the substrates to the gas-liquid interfaces, and processing using chemicals, etc., which are highly reactive with water can be switched therebetween by the thus simple operation of the arms.

The substrate carrier is lifted out of a processing bath with the second holding means engaged in the grooves formed in the holding portions and the openings closed by the holding portions when the substrate carrier is moved with a processing liquid or pure water filled therein; and the substrate carrier is lifted out of the processing bath with the first holding means engaged in the grooves formed in the holding portions when the substrate carrier is moved with the processing liquid or the pure water discharged. Processing without exposing the substrates to the gas-liquid interfaces, and processing using chemicals, etc., which are highly reactive with water can be switched therebetween by the thus simple operation of the arms.

The substrate carrier is lifted out of a processing bath with a bottom of the substrate carrier held by the holding portions and the openings closed when the substrate carrier is moved with a processing liquid or pure water filled therein; and the substrate carrier is lifted out of the processing bath with the bottom held by the holding portions and the openings not closed when the substrate carrier is moved with the processing liquid or the pure water discharged. Processing without exposing the substrates to the gas-liquid interfaces, and processing using chemicals, etc., which are highly reactive with water can be switched therebetween by the thus simple operation of the arms.

The substrate carrier is lifted out of a processing bath by holding the holding means by the holding portions provided on the arms with the openings closed by the closure arms when the substrate carrier is moved with a processing liquid or pure water filled therein; and the substrate carrier is lifted out of the processing bath with the bottom held by the holding portions and the openings not closed when the substrate carrier is moved with the processing liquid or the pure water discharged. Processing without exposing the substrates to the gas-liquid interfaces, and processing using chemicals, etc., which are highly reactive with water can be switched therebetween by the thus simple operation of the arms.

This substrate processing apparatus can use a substrate carrier comprising a box-shaped container having opposed sidewalls, first holding means provided on upper parts of opposed sidewalls of the box-shaped container, second holding means provided at middle parts of the sidewalls with the first holding means thereon provided, and openings formed in lower parts of the sidewalls with the first and the second holding means thereon provided which are below of the second holding means.

This substrate processing apparatus can use a substrate carrier comprising a box-shaped container having opposed sidewalls, first holding means provided on upper parts of opposed sidewalls of the box-shaped container, and openings formed in lower parts of the sidewalls with the first holding means thereon provided which are below of the first holding means.

This substrate processing apparatus can use a substrate carrier comprising a box-shaped container having no opposed sidewalls, first holding means provided on upper parts of opposed sidewalls of the box-shaped container, and second holding means provided at middle parts of the sidewalls with the first holding means thereon provided.

This substrate processing apparatus can use a substrate carrier comprising a box-shaped container, and an opening formed in the bottom of the box-shaped container.

BRIEF DESCRIPTION OF THE DRAWINGS

FIGS. 2A to 2C are explanatory views (part 1) of the substrate processing method and apparatus according to the first embodiment.

FIGS. 5A to 5C are explanatory views (part 1) of the substrate processing method and apparatus according to the second embodiment.

FIGS. 6A to 6C are explanatory views (part 2) of the substrate processing method and apparatus according to the second embodiment.

FIGS. 8A to 8C are explanatory views (part 1) of the substrate processing method and apparatus according to the third embodiment.

FIGS. 9A to 9C are explanatory views (part 2) of the substrate processing method and apparatus according to the third embodiment.

FIGS. 11A to 11C are explanatory views (part 1) of the substrate processing method and apparatus according to the fourth embodiment.

FIGS. 12A to 12C are explanatory views (part 2) of the substrate processing method and apparatus according to the fourth embodiment.

FIGS. 14A to 14C are explanatory views (part 1) of the substrate processing method and apparatus according to the fifth embodiment.

FIG. 18 is an explanatory view of the conventional substrate processing method.

DETAILED DESCRIPTION OF THE INVENTION

A substrate cleaning method and apparatus, and a substrate carrier according to a first embodiment of the present invention will be explained with reference to FIGS. 1A–1C, 2A–2C and 3A–3C.

Figure 1A:
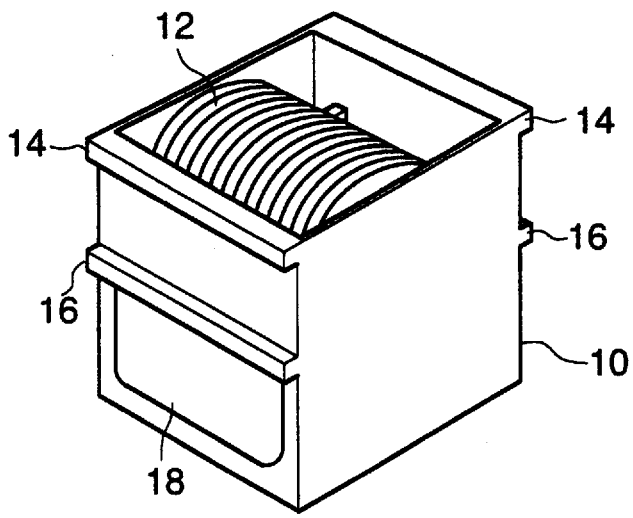
FIGS. 1A to 1C are an appearance view, a top view, and a sectional view, respectively, of the substrate carrier according to a first embodiment of the present invention explaining its structure.
Figure 1B:
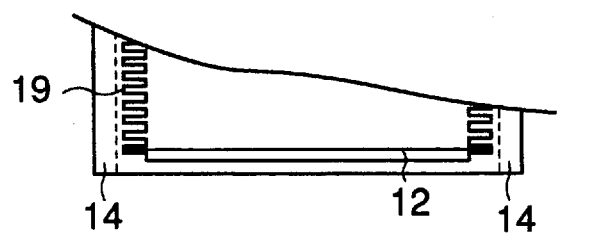
Figure 1C:
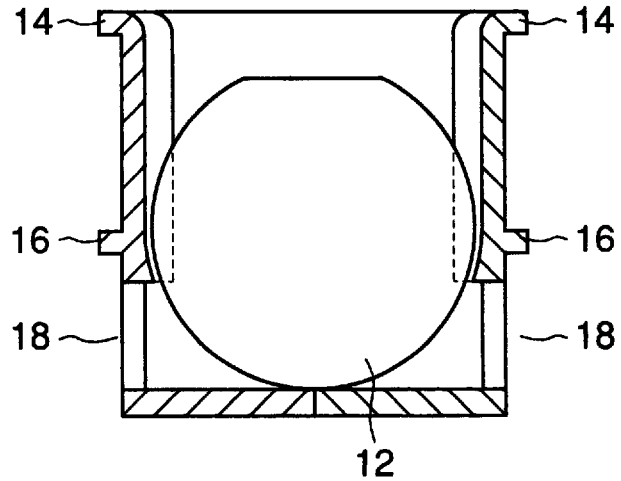

FIGS. 1A to 1C are schematic views of the substrate carrier according to the present embodiment explaining the structure thereof. FIGS. 2A–2C and 3A–3C are views explaining the substrate cleaning method and apparatus according to the present embodiment.

First, the substrate processing apparatus and the substrate carrier according to the present embodiment will be explained.

The substrate processing apparatus according to the present embodiment is basically a multibath processing apparatus and is characterized by the substrate carrier which holds substrates, and arms which grip the substrate carrier.

The substrate processing apparatus according to the present embodiment includes a plurality of processing baths including a processing bath 20 for holding a chemical for processing substrates 12 and a processing bath 22 for holding pure water. Above the processing baths there is disposed a carrier robot 24 which carries a substrate carrier 10 which holds the substrates 12. The carrier robot 24 has arms 26 which grip the substrate carrier 12 (FIG. 2A). The carrier robot 24 has a lift mechanism (not shown) which lowers and lifts the carrier robot 24 to lower and lift the substrate carrier 12 gripped by the arms 26 into and out of the processing baths.

The substrate carrier 10 is a box-shaped container, which holds substrates 12 to be processed. Ridges 14, 16 for holding the substrate carrier 10 are provided respectively on the uppermost parts and the middle parts of the sidewalls opposed to each other. Openings 18 are formed in the parts of the sidewalls below the ridges 16 at the middle of the sidewalls. A plurality of grooves are provided inside the substrate carrier 10, and a plurality of substrates 12 can be held in the grooves without contacting each other (FIGS. 1A to 1C).

The arms 26 have a common swing opening/closing mechanism (not shown). Holding portions 28 of the arms 26 for holding the substrate carrier 10 are larger than the openings 18 in the substrate carrier 10 so as to block the openings 18 when the holding portions 28 hold the ridges 16 (FIG. 2A).

Next, the substrate processing method according to the present embodiment will be explained.

First, substrates 12 to be processed are held in the substrate carrier 10. Then, the substrate carrier 10 is gripped by the arms 26 and carried by the carrier robot 24.

When the substrate carrier 10 is carried to above the chemical processing bath 20, the carrier robot 24 gripping the substrate carrier 10 by the arms 26 is lowered by the lift mechanism to immerse the substrate carrier 10 into a chemical in the processing bath 20. When the substrate carrier 10 is placed in the chemical processing bath 20, the arms 26 are removed from the substrate carrier 10 and are lifted by lifting the carrier robot 24 by the lift mechanism. In this state the chemical processing is conducted for a required period of time.

When the chemical processing is over, the carrier robot is again lowered by the lift mechanism to lower the arms 26, and the arms 26 grip the substrate carrier 10. The holding portions 28 of the arms 26 hold the ridge 16 on the middle parts of the sides of the substrate carrier 10. The openings 18 in the sides of the substrate carrier 10 are thus closed by the holding portions 28.

Then the carrier robot 24 is lifted by the lift mechanism to lift the substrate carrier 10 gripped by the arms 26 out of the chemical processing bath 20, and carries the substrate carrier 10 to above the water cleaning bath 22. The openings 18 are closed by the holding portions 28, and some of the chemical is held in the substrate carrier 10 which has been taken out of the chemical bath 20 (FIGS. 2A (front view) and 2C (side view)).

The holding portions 28 are not in perfect close contact with the openings 18, and some of the chemical leaks from the substrate carrier 10. A substrate carrying time between processing baths is shorter than a time in which the liquid surface of the chemical lowers down to expose the tops of the substrates 12. The substrate carrier 10 can be carried to the water processing bath 22 before any of the substrates 12 reach the gas-liquid interface. The inventors of the present application have found that when an inter-processing bath substrate carrying time is about 8 seconds, the substrate carrier 10 can be carried to the water processing bath 22 before the tops of the substrates 12 reach the surface of the chemical if the upper surface of the substrate carrier 10 is at least 30 mm above the tops of the substrates in the substrate carrier 10.

Then, the carrier robot 24 is lowered, as the substrate carrier 10 was immersed into the chemical, by the lift mechanism to lower the substrate carrier 10 gripped by the arms 26 into the water processing bath 22. When the substrate carrier 10 is placed in the water processing bath 22, the arms 26 are removed from the substrate carrier 10, and the carrier robot 24 is lifted by the lift mechanism to lift the arms 26.

When the substrate carrier 10 is placed in the water processing bath 22, the chemical in the substrate carrier 10 mixes into the water processing bath 22. In the water processing bath 22 overflow rinse is conducted with pure water. The mixed chemical is replaced by the pure water to water rinse the substrates (FIG. 2B).

When the water processing is over, the carrier robot 24 is again lowered by the lift mechanism to lower the arms 26. The arms 26 grip the substrate carrier 10. Then, the carrier robot 24 is lifted by the lift mechanism to lift the arms 26. The substrate carrier 10 is taken out of the water processing bath 22.

When the water cleaning is followed by another chemical processing, the holding portions 28 grip the ridges 16 of the substrate carrier 10 to take the substrate carrier 10 out of the water processing bath 22, and the substrate carrier 10 is carried to another chemical processing bath with the pure water held in the substrate carrier 10. The chemical processing is conducted in the above-described procedure.

When the substrate processing is over, the substrate carrier 10 is carried by the carrier robot 24 sequentially to a neighboring alcohol bath (not shown) and to a warm air drying vessel (not shown).

Thus, the substrate processing is conducted, whereby substrates can be subjected to chemical processing without contact with the gas-liquid interfaces.

The above-described substrate processing method is not applicable to chemical processing using chemicals, such as sulfuric acid, which are highly reactive with water.

Figure 3A:
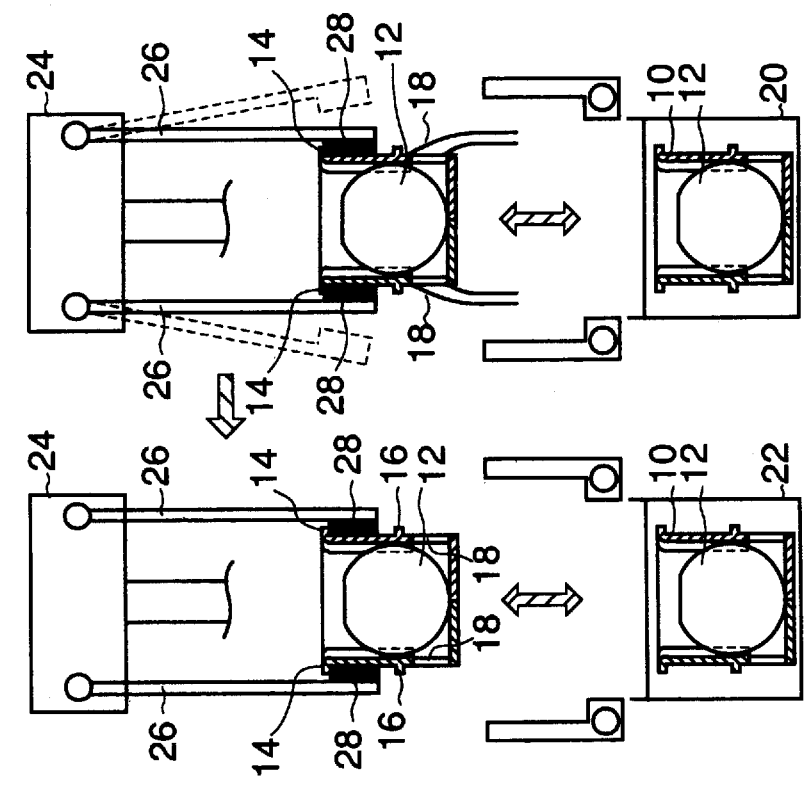
FIGS. 3A to 3C are explanatory views (part 2) of the substrate processing method and apparatus according to the first embodiment.
Figure 3B:
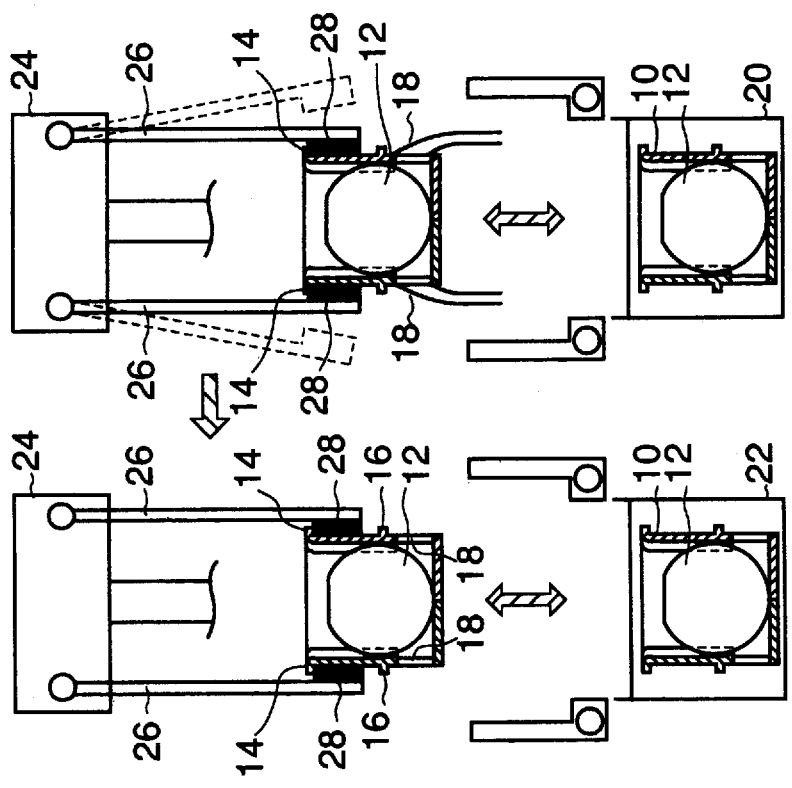
Figure 3C:
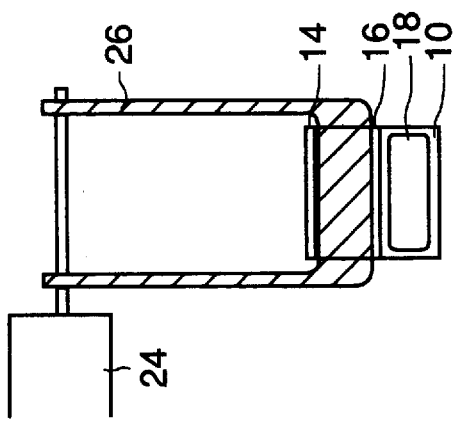

Here the substrate processing method using chemicals which are highly reactive with water will be explained with reference to FIGS. 3A to 3C.

First, substrates 12 to be processed are held in the substrate carrier 10. Then, the substrate carrier 10 is gripped by the arms 26 and carried by the carrier robot 24.

When the substrate carrier 10 is carried to above the chemical processing bath 20, the carrier robot 24 gripping the substrate carrier 10 by the arms 26 is lowered by the lift mechanism to immerse the substrate carrier 10 into a chemical in the processing bath 20. When the substrate carrier 10 is placed in the chemical processing bath 20, the arms 26 are removed from the substrate carrier 10 and are lifted by lifting the carrier robot 24 by the lift mechanism. In this state the chemical processing is conducted for a required period of time.

When the chemical processing is over, the carrier robot is again lowered by the lift mechanism to lower the arms 26, and the arms 26 grip the substrate carrier 10. The holding portions 28 of the arms 26 hold the ridge 14 on the uppermost parts of the sides of the substrate carrier 10.

When the substrate carrier 10 is lifted out of the chemical processing bath 20 by the carrier robot 24 lifted by the lift mechanism, the chemical in the substrate carrier 10 is discharged out of the substrate carrier 10 with the openings 18 of the substrate carrier 10 not closed by the holding portions 28. (FIG. 3A).

Subsequently the substrate carrier 10 which has been carried by the carrier robot 24 to above the water processing bath 22 is lowered into the water processing bath 22 by the carrier robot 24 gripping the substrate carrier 10 by the arms 26 lowered by the lift mechanism as was done in immersing the substrate carrier into the chemical. Almost all of the chemical in the substrate carrier 10 has been discharged by this time, and no vigorous reaction with water takes place.

When the substrate carrier 10 is placed in the water processing bath 22, the arms 26 are removed from the substrate carrier 12, and the carrier robot 24 is lifted by the lift mechanism to lift the arms 26. In this state water rinse is conducted for a required period of time (FIG. 3B).

When the water rinse is over, the carrier robot 24 is again lowered by the lift mechanism to lower the arms 26, and the substrate carrier 10 is gripped by the arms 26. Then, the carrier robot 24 is lifted by the lift mechanism to lift the arms 26 to take the substrate carrier 10 out of the water processing bath 22.

When another chemical processing follows the water rinse, depending on the chemical to be used in the following chemical processing either of the ridges 14 or 16 is selected to take the substrate carrier 10 out of the water processing bath 22. For example, if the chemical is highly reactive with water, the ridges 14 are gripped by the arms 26, so that after the pure water has been discharged, the substrate carrier 10 is carried to a processing bath for the following chemical processing. If the chemical is not highly reactive, the ridges 16 are gripped, so that the substrate carrier 10 is carried to the processing bath for the following chemical processing with the pure water held in the substrate carrier 10. The above-described chemical processing is again conducted.

When the substrate processing is over, the substrate carrier 10 is carried by the carrier robot 24 to a neighboring alcohol bath (not shown) and to a warm air drying vessel (not shown) to dry the substrates. A line of processing is completed.

The substrate processing in this manner enables the substrate processing apparatus to be used also for the substrate processing with chemicals which are highly reactive with water.

The substrate carrier gripping positions of the arms 26 must be selected for the case that the substrate carrier 10 is carried with a chemical held therein and for the case that the substrate carrier 10 is carried with a chemical discharged therefrom. The lift mechanism for the substrate carrier 10 only includes two upper and the lower stop position sensors. The selection of the gripping positions of the arms 26 can be easily achieved without making the control system complicated.

According to the present embodiment, in the multibath processing apparatus the openings in the substrate carrier are closed by the holding portions when the substrate carrier is moved among the processing baths with chemicals filling the substrate carrier. During a line of processing the substrates do not contact the gas-liquid interfaces. Adhesion of particles can be reduced equally to that in the single bath processing apparatus.

The chemical amount consumed in one chemical processing is a volume equal to the volume of the substrate carrier. In comparison with that of the conventional single bath processing apparatus which consumes a chemical amount equal to one processing bath of a chemical, the amount of chemical consumed can be reduced to less than half.

The processing bath of the single bath processing apparatus can be used as it is, in the multibath processing apparatus. The processing baths can be configured suitable for processing of required chemicals, waster rinse, etc. Products can be continuously processed. Higher throughputs can be obtained in comparison with those of the single bath processing apparatus.

The substrate carrier gripping positions of the arms are simply changed to move the substrate carrier while chemicals are discharged therefrom. Chemical processing using chemicals which are highly reactive with water can be conducted in a line of processing.

In the above-described embodiment, the number of substrates to be processed are not necessarily plurality and could also be one substrate.

In the above-described embodiment, the substrates to be processed are semiconductor wafers. In this specification, the substrates are not necessarily semiconductor wafers and could also be reticles, photomasks, LCD substrates, etc. Their cleaning method, apparatus, etc. are the same as described above.

The substrate processing method and apparatus, and the substrate carrier according to a second embodiment of the present invention will be explained with reference to FIGS. 4A–4C, 5A–5C and 6A–6C.

Figure 4A:
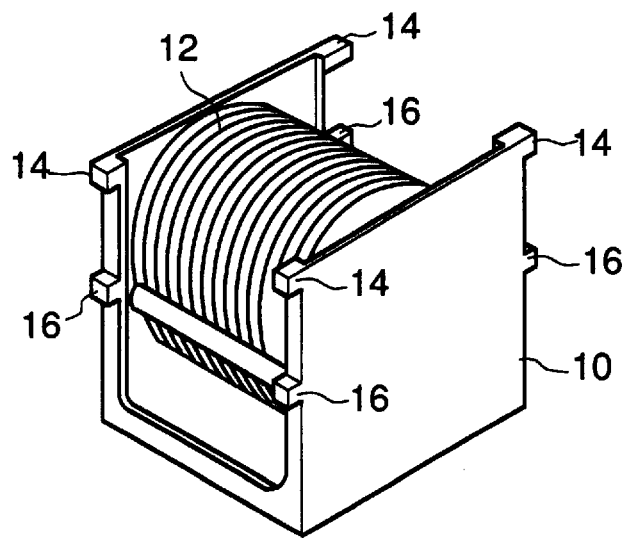
FIGS. 4A to 4C are an appearance view, a top view, and a sectional view, respectively, of the substrate carrier according to a second embodiment explaining its structure.
Figure 4B:
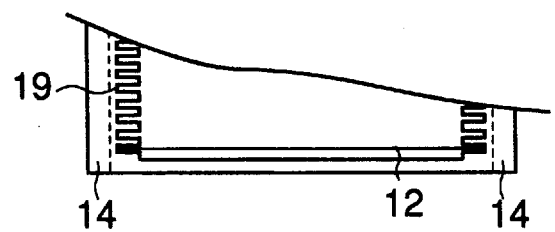
Figure 4C:
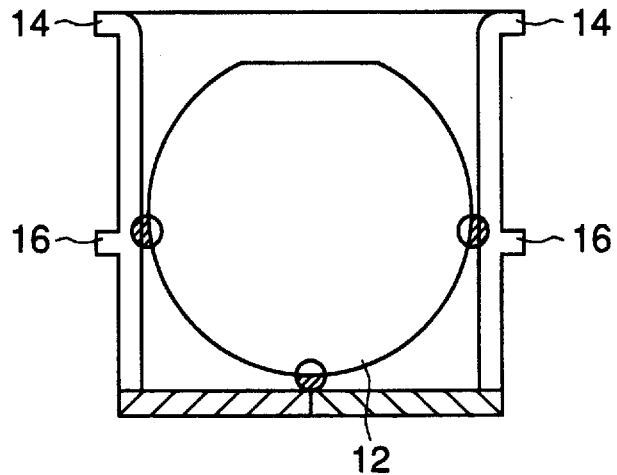
Figure 7A:
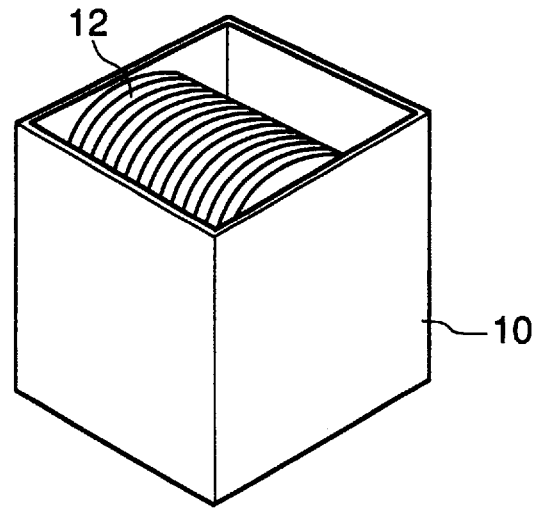
FIGS. 7A to 7D are an appearance view, a top view, a sectional view, and a bottom view, respectively, of the substrate carrier according to a third embodiment of the present invention explaining its structure.
Figure 7B:
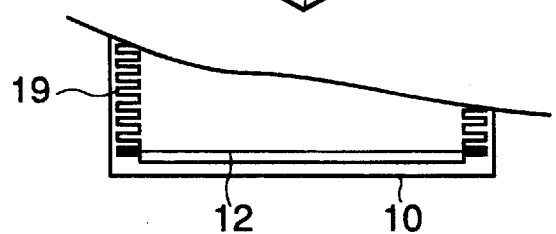
Figure 7C:
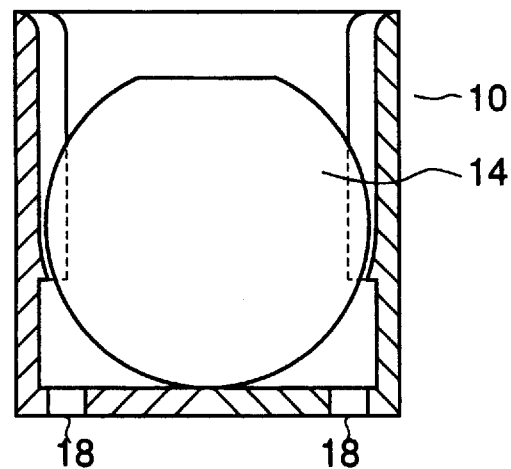
Figure 7D:

FIGS. 4A to 4C are views of the substrate carrier according to the second embodiment explaining its structure. FIGS. 5A–5C and 6A–6C are explanatory views of the substrate cleaning method and apparatus according to the second embodiment.

First, the substrate processing apparatus and the substrate carrier according to the present embodiment will be explained.

The substrate processing apparatus according to the present embodiment includes a plurality of processing baths including a processing bath 20 for holding a chemical for processing substrates 12 and a processing bath 22 for holding pure water. Above the processing baths there is disposed a carrier robot 24 which carries a substrate carrier 10 which holds the substrates 12. The carrier robot 24 has arms 26 which grip the substrate carrier 12 (FIG. 5A). The carrier robot 24 has a lift mechanism (not shown) which lowers and lifts the carrier robot 24 to lower and lift the substrate carrier 12 gripped by the arms 26 into and out of the processing baths.

The substrate carrier 10 comprises a box-shaped container whose upper surface and the opposed sidewalls opened. Lugs 14, 16 for holding the substrate carrier 10 are provided respectively on both uppermost parts and both middle parts of the opened sidewalls. A plurality of grooves 19 are provided inside the substrate carrier 10, and a plurality of substrates 12 can be held spaced from each other (FIGS. 4A to 4C).

The arms 26 have a common swing opening/closing mechanism (not shown). Holding portions 28 of the arms 26 can close substantially the entire sidewalls of the substrate carrier 10 when the holding portions 28 hold the lugs 16 of the substrate carrier 10. The holding portions 28 have respective grooves 30 which receive the lugs 14 or 16 when the holding porions 28 hold the lugs 14 or 16 (FIG. 5A).

Then, the substrate processing method according to the present embodiment will be explained.

Substrates 12 to be processed are held in the substrate carrier 10. Then, the substrate carrier 10 is gripped by the arms 26 to be carried by the carrier robot 24.

The substrate carrier 10 is moved to above the chemical processing bath 20, and then the carrier robot 24 is lowered by the lift mechanism to lower the arms 26 to immerse the substrate carrier 10 into the chemical. When the substrate carrier 10 is placed in the chemical bath 20, the arms 26 are removed from the substrate carrier 12, and the carrier robot 24 is lifted by the lift mechanism to lift the arms 26. In this state the chemical processing is performed for a required period of time.

Then the chemical processing is over, the carrier robot 24 is lowered by the lift mechanism to lower the arms 26, and the substrate carrier 10 is held by the holding portions of the arms 26. At this time, the grooves 30 in the holding portions 28 receive the lugs 16 on the middle of the sidewalls of the substrate carrier 10. The opened parts of the sidewalls of the substrate carrier 10 are closed by the holding portions 28 of the arms 26.

Then, the carrier robot 24 is lifted by the lift mechanism to lift the arms 26, and the substrate carrier 10 is taken out of the chemical processing bath 20 and carried by the carrier robot 24 to above the water processing bath 22. At this time, with the opened parts 18 closed by the holding portions 28, the chemical fills the carrier substrate 10 which has been taken out of the chemical processing bath 20.

The holding portions 28 do not perfectly close tightly the sidewalls of the substrate carrier 10, and some of the chemical in the substrate carrier 10 leaks. As in the first embodiment, an inter-processing bath substrate carrier carrying time is so short that the substrate carrier 10 can be carried to the water processing bath before the upper portions of the substrates 12 reach the liquid surface (FIGS. 5A (front view) and 5C (side view)).

Then, in the same way as the substrate carrier was immersed into the chemical, the carrier robot 24 is lowered by the lift mechanism to lower the arms 26 into the water processing bath 22. When the substrate carrier 10 is placed in the water processing bath 22, the arms 26 are removed from the substrate carrier 12, and the carrier robot 24 is lifted by the lift mechanism to lift the arms 26.

When the substrate carrier 10 is placed in the water processing bath 22, the chemical held in the substrate carrier 10 mixes into the water processing bath 22. In the water processing bath 22 overflow rinse, etc., are conducted with pure water, and the mixed chemical is replaced by the pure water for water rinse.

At this time, the chemical in the substrate carrier 10, all the opposed sidewalls of which are opened, can be efficiently replaced by the pure water. That is, the rinse time can be shorter (FIG. 5B).

When the water rinse is over, the carrier robot 24 is lowered by the lift mechanism to lower the arm 26, and the arms 26 grip the substrate carrier 10. Then, the carrier robot 24 is lifted by the lift mechanism to lift the arms 26, and the substrate carrier 10 is taken out of the water processing bath 22.

When another chemical processing follows the water rinse, the lugs 16 of the substrate carrier 10 are received in the grooves 30 in the holding portions 28 when the substrate carrier is taken out of the water processing bath, and is carried to another chemical processing bath with the pure water held therein. The chemical processing is again conducted in the above-described procedure.

When the substrate processing is finished, the substrate carrier 10 is carried by the carrier robot 24 sequentially to a neighboring alcohol processing bath (not shown) and to a warm air drying vessel (not shown) to dry the substrates. A line of processing is over.

This substrate processing enables substrates to be subjected to chemical processing without contacting the substrates with the gas-liquid interfaces.

The above-described substrate processing is not applicable to chemical processing with chemicals, such as sulfuric acid, which are highly reactive with water.

The substrate processing method using a chemical which is highly reactive with water will be explained with reference to FIGS. 6A to 6C.

First, substrates 12 to be processed are held in the substrate carrier 10. Then, the substrate carrier 10 is gripped by the arms 26 and carried by the carrier robot 24.

When the substrate carrier 10 is carried to above the chemical processing bath 20, the carrier robot 24 gripping the substrate carrier 10 by the arms 26 is lowered by the lift mechanism to immerse the substrate carrier 10 into a chemical in the processing bath 20. When the substrate carrier 10 is placed in the chemical processing bath 20, the arms 26 are removed from the substrate carrier 10 and are lifted by lifting the carrier robot 24 by the lift mechanism. In this state the chemical processing is conducted for a required period of time.

When the chemical processing is over, the carrier robot is again lowered by the lift mechanism to lower the arms 26, and the arms 26 grip the substrate carrier 10. The grooves 30 of the holding portions 28 of the arms 26 receive the lugs 14 on the upper parts of the sidewalls of the substrate carrier 10.

When the substrate carrier 10 is lifted out of the chemical processing bath 20 by the carrier robot 24 lifted by the lift mechanism, the chemical in the substrate carrier 10 is discharged out of the substrate carrier 10 with the sidewalls of the substrate carrier 10 not closed by the holding portions 28. (FIGS. 6A and 6B).

Subsequently the substrate carrier which has been carried by the carrier robot 24 to above the water processing bath 22 is lowered into the water processing bath 22 by the carrier robot 24 gripping the substrate carrier 10 by the arms 26 lowered by the lift mechanism as was done in immersing the substrate carrier into the chemical. Almost all of the chemical in the substrate carrier 10 has been discharged by this time, and no vigorous reaction with water takes place.

When the substrate carrier 10 is placed in the water processing bath 22, the arms 26 are removed from the substrate carrier 12, and the carrier robot 24 is lifted by the lift mechanism to lift the arms 26. In this state water rinse is conducted for a required period of time (FIG. 6B).

When the water rinse is over, the carrier robot 24 is again lowered by the lift mechanism to lower the arms 26, and the substrate carrier 10 is gripped by the arms 26. Then, the carrier robot 24 is lifted by the lift mechanism to lift the arms 26 to take the substrate carrier 10 out of the water processing bath 22.

When another chemical processing follows the water rinse, depending on a chemical to be used in the following chemical processing either pair of the lugs is selected to take the substrate carrier 10 out of the water processing bath 22. For example, if the chemical is highly reactive with water, the lugs 14 are received in the grooves 30, so that after the pure water has been discharged, the substrate carrier 10 is carried to a processing bath for the following chemical processing. If the chemical is not highly reactive with water, the lugs 16 are received in the grooves 30, so that the substrate carrier 10 is carried to the processing bath for the following chemical processing with the pure water held in the substrate carrier 10. The above-described chemical processing is again conducted.

When the substrate processing is over, the substrate carrier 10 is carried by the carrier robot 24 to a neighboring alcohol bath (not shown) and to a warm air drying vessel (not shown) to dry the substrates. A line of processing is completed.

The substrate processing in this manner enables the substrate processing apparatus to be used also for the substrate processing with chemicals which are highly reactive with water.

According to the present embodiment, in the multibath processing apparatus the sidewalls of the substrate carrier are closed by the holding portions when the substrate carrier is moved among the processing baths with chemicals filling the substrate carrier. During a line of processing the substrates do not contact the gas-liquid interfaces. Adhesion of particles can be reduced equally to that in the single bath processing apparatus.

The opposed sidewalls of the substrate carrier are opened, which facilitate the replacement of chemical with pure water for water rinse. The rinse time can be shortened, and higher throughputs can be obtained.

The substrate processing method and apparatus, and the substrate carrier according to a third embodiment of the present invention will be explained with reference to FIGS. 7A–7D, 8A–8C, 9A–9C.

FIGS. 7A to 7D are views of the substrate carrier according to the third embodiment explaining its structure. FIGS. 8A–8C and 9A–9C are explanatory views of the substrate cleaning method and apparatus according to the third embodiment.

First, the substrate processing apparatus and the substrate carrier according to the present embodiment will be explained.

The substrate processing apparatus according to the present embodiment includes a plurality of processing baths including a processing bath 20 for holding a chemical for processing substrates 12 and a processing bath 22 for holding pure water. Above the processing baths there is disposed a carrier robot 24 which carries a substrate carrier 10 which holds the substrates 12. The carrier robot 24 has arms 26 which grip the substrate carrier 12 (FIG. 8A). The carrier robot 24 has a lift mechanism (not shown) which lowers and lifts the carrier robot 24 to lower and lift the substrate carrier 12 gripped by the arms 26 into and out of the processing baths.

The substrate carrier 10 comprises a box-shape which holds substrates 12 to be processed. Openings 18 are formed in lower parts of opposed sidewalls of the substrate carrier 10. A plurality of grooves 19 are provided in the substrate carrier 10. The grooves 19 space a plurality of substrates 12 from each other in the substrate carrier 10 (FIGS. 7A to 7D).

The arms 26 have a common slide opening/closing mechanism (not shown) and can support the substrate carrier at the bottom by holding portions 28 thereof. The holding portions 28 of the arms 26 close the openings 18 in the lower parts of the sidewalls of the substrate carrier 10 when the arms 26 hold the substrate carrier 10 (FIG. 8A).

Then, the substrate processing method according to the present embodiment will be explained.

Substrates 12 to be processed are held in the substrate carrier 10. Then, the substrate carrier 10 is gripped by the arms 26 to be carried by the carrier robot 24.

The substrate carrier 10 is moved to above the chemical processing bath 20, and then the carrier robot 24 is lowered by the lift mechanism to lower the arms 26 to immerse the substrate carrier 10 into the chemical. When the substrate carrier 10 is placed in the chemical bath 20, the arms 26 are removed from the substrate carrier 12, and the carrier robot 24 is lifted by the lift mechanism to lift the arms 26. In this state the chemical processing is performed for a required period of time.

Then, when the chemical processing is over, the carrier robot 24 is lowered by the lift mechanism to lower the arms 26, and the substrate carrier 10 is held by the arms 26. At this time, the arms 26 are slid so that the holding portions 28 of the arms 26 sufficiently close the openings 18 in the lower parts of the sidewalls of the substrate carrier 10.

Then, the carrier robot 24 is lifted by the lift mechanism to lift the arms 26, and the substrate carrier 10 is taken out of the chemical processing bath 20 and carried by the carrier robot 24 to above the water processing bath 22. At this time, with the openings 18 closed by the holding portions 28, the chemical fills the carrier substrate 10 which has been taken out of the chemical processing bath 20.

The holding portions 28 do not perfectly close tightly the openings 18 of the substrate carrier 10, and some of the chemical in the substrate carrier 10 leaks. As in the first embodiment, an inter-processing bath substrate carrier carrying time is so short that the substrate carrier 10 can be carried to the water processing bath before the upper portions of the substrates 12 reach the liquid surface (FIGS. 8A (front view) and 8C (side view)).

Then, in the same way as the substrate carrier was immersed into the chemical, the carrier robot 24 is lowered by the lift mechanism to lower the arms 26 into the water processing bath 22. When the substrate carrier 10 is placed in the water processing bath 22, the arms 26 are removed from the substrate carrier 12, and the carrier robot 24 is lifted by the lift mechanism to lift the arms 26.

When the substrate carrier 10 is placed in the water processing bath 22, the chemical held in the substrate carrier 10 mixes into the water processing bath 22. In the water processing bath 22 overflow rinse, etc., are conducted with pure water, and the mixed chemical is replaced by the pure water for water rinse (FIG. 8B).

When the water rinse is over, the carrier robot 24 is lowered by the lift mechanism to lower the arm 26, and the arms 26 grip the substrate carrier 10. Then, the carrier robot 24 is lifted by the lift mechanism to lift the arms 26, and the substrate carrier 10 is taken out of the water processing bath 22.

When another chemical processing follows the water rinse, the openings 18 of the substrate carrier 10 are closed by the holding porions 28 when the carrier substrate 10 is taken out of the water processing bath 22, and is carried to another chemical processing bath with the pure water held therein. The chemical processing is again conducted in the above-described procedure.

When the substrate processing is finished, the substrate carrier 10 is carried by the carrier robot 24 sequentially to a neighboring alcohol processing bath (not shown) and to a warm air drying vessel (not shown) to dry the substrates. A line of processing is over.

This substrate processing enables substrates to be subjected to chemical processing without contacting the substrates with the gas-liquid interfaces.

The above-described substrate processing is not applicable to chemical processing with chemicals, such as sulfuric acid, which are highly reactive with water.

The substrate processing method using a chemical which is highly reactive with water will be explained with reference to FIGS. 9A to 9C.

First, substrates 12 to be processed are held in the substrate carrier 10. Then, the substrate carrier 10 is gripped by the arms 26 and carried by the carrier robot 24.

When the substrate carrier 10 is carried to above the chemical processing bath 20, the carrier robot 24 gripping the substrate carrier 10 by the arms 26 is lowered by the lift mechanism to immerse the substrate carrier 10 into a chemical in the processing bath 20. When the substrate carrier 10 is placed in the chemical processing bath 20, the arms 26 are removed from the substrate carrier 10 and are lifted by lifting the carrier robot 24 by the lift mechanism. In this state the chemical processing is conducted for a required period of time.

When the chemical processing is over, the carrier robot is again lowered by the lift mechanism to lower the arms 26, and the arms 26 hold the substrate carrier 10. The arms 26 are slid so that the holding portions 28 of the arms 26 do not entirely close the entire openings 18 in the lower parts of the sidewalls of the substrate carrier 10.

When the substrate carrier 10 is lifted out of the chemical processing bath 20 by the carrier robot 24 lifted by the lift mechanism, the chemical in the substrate carrier 10 is discharged out of the substrate carrier 10 with the openings 18 of the substrate carrier 10 not entirely closed by the holding portions 28. (FIGS. 9A and 9B).

Subsequently, the substrate carrier which has been carried by the carrier robot 24 to above the water processing bath 22 is lowered into the water processing bath 22 by the carrier robot 24 gripping the substrate carrier 10 by the arms lowered by the lift mechanism as was done in immersing the substrate carrier into the chemical. Almost of the chemical in the substrate carrier 10 has been discharged by this time, and no vigorous reaction with water takes place (FIG. 9B).

When the substrate carrier 10 is placed in the water processing bath 22, the arms 26 are removed from the substrate carrier 12, and the carrier robot 24 is lifted by the lift mechanism to lift the arms 26. In this state, water rinse is conducted for a required period of time.

When the water rinse is over, the carrier robot 24 is again lowered by the lift mechanism to lower the arms 26, and the substrate carrier 10 is gripped by the arms 26. Then, the carrier robot 24 is lifted by the lift mechanism to lift the arms 26 to take the substrate carrier 10 out of the water processing bath 22.

When another chemical processing follows the water rinse, depending on the chemical to be used in the following chemical processing, the arms 26 are operated. In a case, for example, that a chemical is highly reactive with water, the substrate carrier is held with the openings 18 not entirely closed to let out the pure water in the substrate carrier 10, and then is moved. Otherwise, the substrate carrier 10 is held with the openings 18 closed, and the substrate carrier 10 is moved to another chemical processing bath with the pure water held in the substrate carrier 10. The above-described substrate processing is again conducted.

When the substrate processing is over, the substrate carrier 10 is carried by the carrier robot 24 to a neighboring alcohol bath (not shown) and to a warm air drying vessel (not shown) to dry the substrates. A line of processing is completed.

The substrate processing in this manner enables the substrate processing apparatus to be used also for the substrate processing with chemicals which are highly reactive with water.

According to the present embodiment, in the multibath processing apparatus the openings in the lower parts of the sidewalls of the substrate carrier are closed, and the substrate carrier is moved among the processing baths. During a line of processing the substrates do not contact the gas-liquid interfaces. Adhesion of particles can be reduced equally to that in the single bath processing apparatus.

The substrate processing method and apparatus, and the substrate carrier according to a fourth embodiment of the present invention will be explained with reference to FIGS. 10A–10C, 11A–11C and 12A–12C.

Figure 10A:
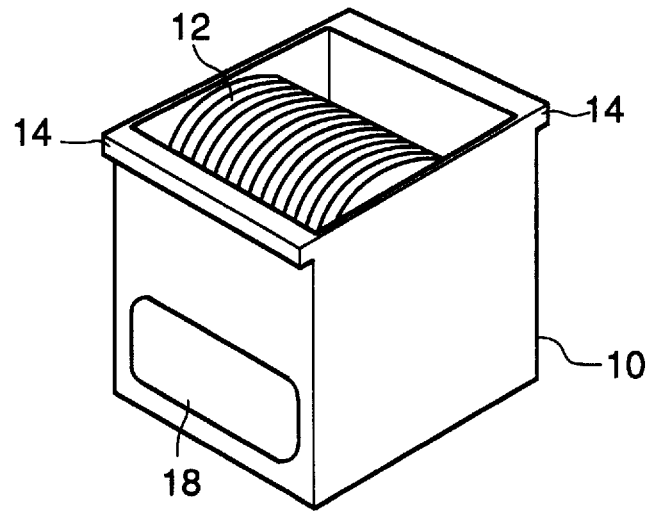
FIGS. 10A to 10C are an appearance view, a top view, and a sectional view, respectively, of the substrate carrier according to a fourth embodiment explaining its structure.
Figure 10B:
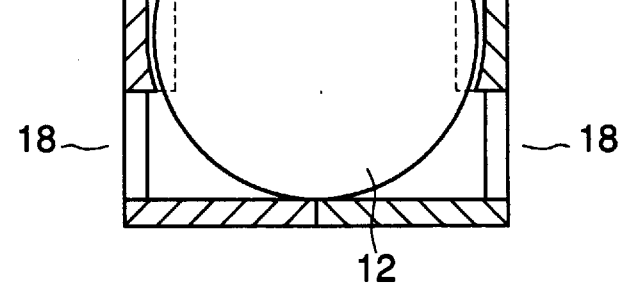
Figure 10C:
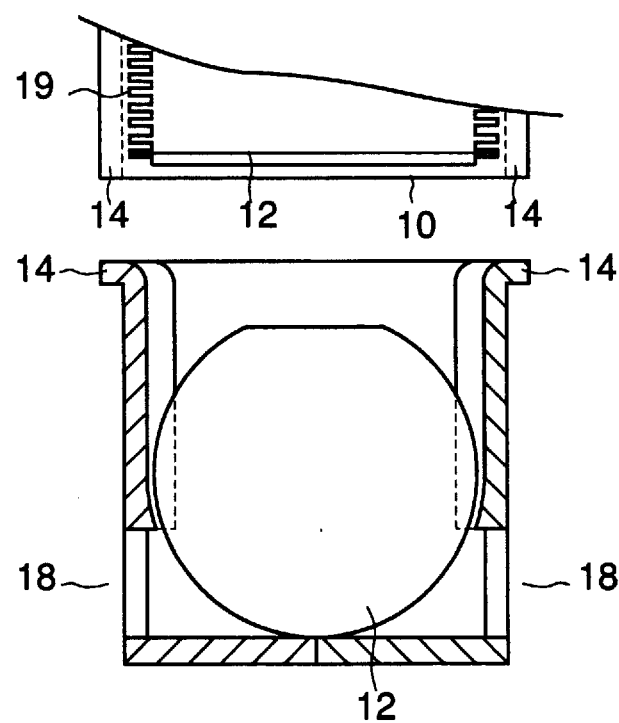

FIGS. 10A to 10C are views of the substrate carrier according to the fourth embodiment explaining its structure. FIGS. 11A–11C and 12A–12C are explanatory views of the substrate cleaning method and apparatus according to the fourth embodiment.

First, the substrate processing apparatus and the substrate carrier according to the present embodiment will be explained.

The substrate processing apparatus according to the present embodiment includes a plurality of processing baths including a processing bath 20 for holding a chemical for processing substrates 12 and a processing bath 22 for holding pure water. Above the processing baths there is disposed a carrier robot 24 which carries a substrate carrier 10 which holds the substrates 12. The carrier robot 24 has arms 26 which grip the substrate carrier 12 and closure arms 32 for closing the openings 18 in the substrate carrier 10 (FIG. 11A). The carrier robot 24 has a lift mechanism (not shown) which lowers and lifts the carrier robot 24 to lower and lift the substrate carrier 12 gripped by the arms 26 and the closure arms 32 into and out of the processing baths.

The substrate carrier 10 comprises a box-shaped which holds substrates 12 to be processed. Openings 18 are formed in lower parts of opposed sidewalls of the substrate carrier 10. Ridges 14 to be gripped by the arms 26 of the carrier robot 10 are provided on upper parts of opposed sidewalls of the substrate carrier 10. Openings 18 are formed in parts of the sidewalls from the central part to below. A plurality of grooves 19 are provided inside the substrate carrier 10. A plurality of substrates 12 can be spaced from each other in the substrate carrier 10 (FIGS. 10A to 10C).

The arms 26 have a common swing opening/closing mechanism (not shown) and can grip the ridges 14 of the substrate carrier. The closure arms 32 have a common swing opening/closing mechanism (not shown). When the arms 26 grip the substrate carrier, the closure arms 32 can close the openings 18. The arms 26, and the closure arms 32 can be operated independently from each other (FIG. 11A).

Then, the substrate processing method according to the present embodiment will be explained.

Substrates 12 to be processed are held in the substrate carrier 10. Then, the substrate carrier 10 is gripped by the arms 26 to be carried by the carrier robot 24.

The substrate carrier 10 is moved to above the chemical processing bath 20, and then the carrier robot 24 is lowered by the lift mechanism to lower the arms 26 to immerse the substrate carrier 10 into the chemical. When the substrate carrier 10 is placed in the chemical bath 20, the arms 26 are removed from the substrate carrier 12, and the carrier robot 24 is lifted by the lift mechanism to lift the arms 26. In this state the chemical processing is performed for a required period of time.

Then when the chemical processing is over, the carrier robot 24 is lowered by the lift mechanism to lower the arms 26, and the substrate carrier 10 is held by the arms 26. At this time, the openings 18 in the substrate carrier 10 are closed by the closure arms 32.

Then, with the openings 18 in the substrate carrier 19 closed by the closure arms 32, the carrier robot 24 is lifted by the lift mechanism to lift the arms 26, and the substrate carrier 10 is taken out of the chemical processing bath 20 and carried by the carrier robot 24 to above the water processing bath 22. At this time, with the openings 18 in the substrate carrier 10 closed by the closure arms 32, the substrate carrier 10 which has been taken out of the chemical bath 20 is filled with the chemical.

The holding portions 28 do not perfectly close tightly the openings 18, and some of the chemical in the substrate carrier 10 leaks. As in the first embodiment, an inter-processing bath substrate carrier carrying time is so short that the substrate carrier 10 can be carried to the water processing bath before the upper portions of the substrates 12 reach the liquid surface (FIGS. 11A (front view) and 11C (side view)).

Then, in the same way as the substrate carrier was immersed into the chemical, the carrier robot 24 is lowered by the lift mechanism to lower the arms 26 into the water processing bath 22. When the substrate carrier 10 is placed in the water processing bath 22, the arms 26 are removed from the substrate carrier 12, and the carrier robot 24 is lifted by the lift mechanism to lift the arms 26.

When the substrate carrier 10 is placed in the water processing bath 22, the chemical held in the substrate carrier 10 mixes into the water processing bath 22. In the water processing bath 22 overflow rinse, etc., are conducted with pure water, and the mixed chemical is replaced by the pure water for water rinse (FIG. 11B).

When the water rinse is over, the carrier robot 24 is lowered by the lift mechanism to lower the arm 26, and the arms 26 grip the substrate carrier 10. Then, the carrier robot 24 is lifted by the lift mechanism to lift the arms 26, and the substrate carrier 10 is taken out of the water processing bath 22.

When another chemical processing follows the water rinse, the openings 18 of the substrate carrier 10 are closed by the holding porions 28 when the carrier substrate 10 is taken out of the water processing bath 22, and is carried to another chemical processing bath with the pure water held therein. The chemical processing is again conducted in the above-described procedure.

When the substrate processing is finished, the substrate carrier 10 is carried by the carrier robot 24 sequentially to a neighboring alcohol processing bath (not shown) and to a warm air drying vessel (not shown) to dry the substrates. A line of processing is over.

This substrate processing enables substrates to be subjected to chemical processing without contacting the substrates with the gas-liquid interfaces.

The above-described substrate processing is not applicable to chemical processing with chemicals, such as sulfuric acid, which are highly reactive with water.

The substrate processing method using a chemical which is highly reactive with water will be explained with reference to FIGS. 12A to 12C.

First, substrates 12 to be processed are held in the substrate carrier 10. Then, the substrate carrier 10 is gripped by the arms 26 and carried by the carrier robot 24.

When the substrate carrier 10 is carried to above the chemical processing bath 20, the carrier robot 24 gripping the substrate carrier 10 by the arms 26 is lowered by the lift mechanism to immerse the substrate carrier 10 into a chemical in the processing bath 20. When the substrate carrier 10 is placed in the chemical processing bath 20, the arms 26 are removed from the substrate carrier 10 and are lifted by lifting the carrier robot 24 by the lift mechanism. In this state the chemical processing is conducted for a required period of time.

When the chemical processing is over, the carrier robot is again lowered by the lift mechanism to lower the arms 26, and the arms 26 hold the substrate carrier 10. The closure arms 32 are kept opened.

When the substrate carrier 10 is lifted out of the chemical processing bath 20 by the carrier robot 24 lifted by the lift mechanism, the chemical in the substrate carrier 10 is discharged out of the substrate carrier 10 with the openings 18 in the substrate carrier 10 not closed by the closure arms 32 (FIGS. 12A and 12C).

Subsequently the substrate carrier which has been carried by the carrier robot 24 to above the water processing bath 22 is lowered into the water processing bath 22 by the carrier robot 24 gripping the substrate carrier 10 by the arms 26 lowered by the lift mechanism as was done in immersing the substrate carrier into the chemical. Almost of the chemical in the substrate carrier 10 has been discharged by this time, and no vigorous reaction with water takes place (FIG. 12B).

When the substrate carrier 10 is placed in the water processing bath 22, the arms 26 are removed from the substrate carrier 12, and the carrier robot 24 is lifted by the lift mechanism to lift the arms 26. In this state water rinse is conducted for a required period of time.

When the water rinse is over, the carrier robot 24 is again lowered by the lift mechanism to lower the arms 26, and the substrate carrier 10 is gripped by the arms 26. Then, the carrier robot 24 is lifted by the lift mechanism to lift the arms 26 to take the substrate carrier 10 out of the water processing bath 22.

When another chemical processing follows the water rinse, depending on the chemical to be used in the following chemical processing, the closure arms 32 are operated. In a case, for example, that a chemical is highly reactive with water, the substrate carrier 10 is lifted out of the water processing bath with the closure arms 32 opened to let out the pure water in the substrate carrier 10, and then is moved. In a case that the chemical is not highly reactive with water, the substrate carrier 10 is lifted out of the water processing bath with the closure arms 32 closed, and the substrate carrier 10 is moved to another chemical processing bath with the pure water held in the substrate carrier 10. The above-described substrate processing is again conducted.

When the substrate processing is over, the substrate carrier 10 is carried by the carrier robot 24 to a neighboring alcohol bath (not shown) and to a warm air drying vessel (not shown) to dry the substrates. A line of processing is completed.

The substrate processing in this manner enables the substrate processing apparatus to be used also for the substrate processing with chemicals which are highly reactive with water.

According to the present embodiment, in addition to the first arms which hold the substrate carrier, there are provided second arms which close the openings in the sidewalls of the substrate carrier, and when the substrate carrier is moved, the openings are closed by the holding portions on the second arms. The carrier substrate is moved among the processing baths with a chemical filled therein. During a line of processing the substrates do not contact the gas-liquid interfaces. Adhesion of particles can be reduced equally to that in the single bath processing apparatus.

Unless the openings are closed by the second arms, the chemical held in the substrate carrier can be discharged when the substrate carrier is moved. Chemical processing using chemicals which are highly reactive with water can be readily included in a line of processing.

The first to the fourth embodiments have shown variations of the substrate processing apparatus including the substrate carrier with openings, and holders which can close the openings in the substrate carrier. The present invention is not limited to the above-described embodiments as long as openings in a substrate carrier are closed by holding potions when the substrate carrier is moved with a processing liquid held in the substrate carrier.

The substrate processing method and apparatus, and the substrate carrier according to a fifth embodiment of the present invention will be explained with reference to FIGS. 13A–13C, 14A–14C and 15A–15C.

Figure 13A:
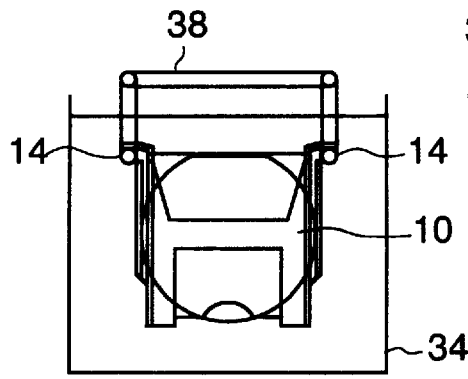
FIGS. 13A to 13C are an appearance view, a top view, and a sectional view, respectively, of the substrate carrier according to a fifth embodiment of the present invention, explaining its structure.
Figure 13B:
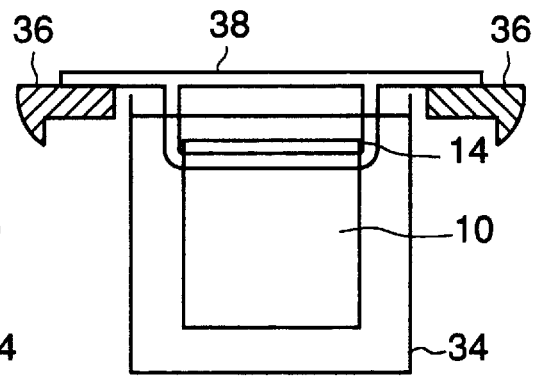
Figure 13C:
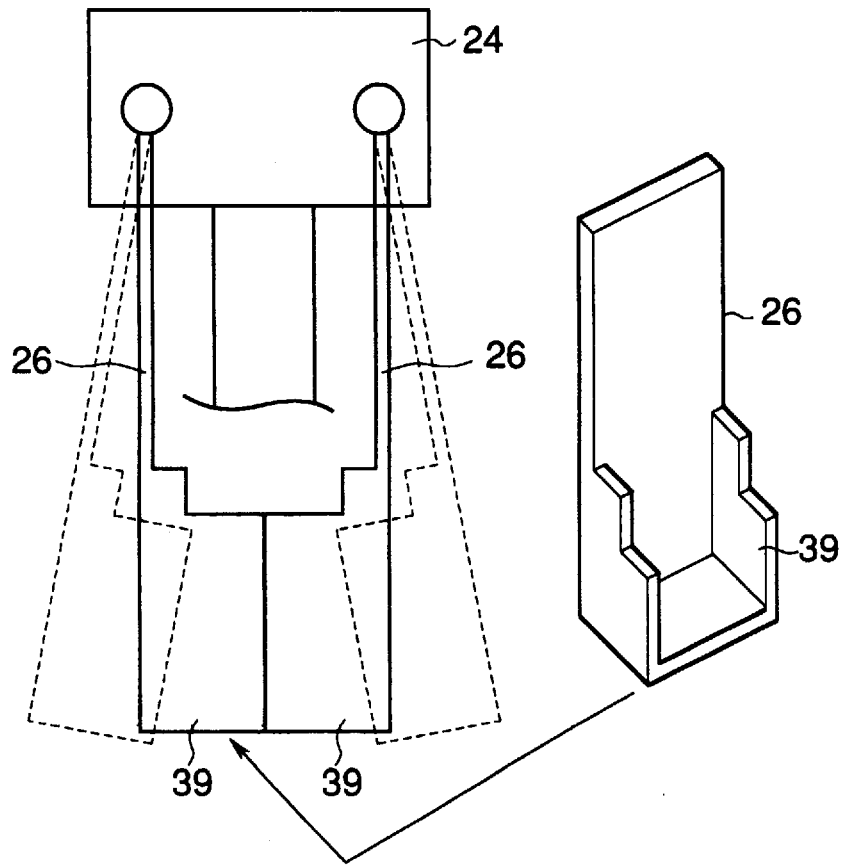

FIGS. 13A to 13C are views of the substrate carrier according to the fifth embodiment explaining its structure. FIGS. 14A–14C and 15A–15C are explanatory views of the substrate cleaning method and apparatus according to the fifth embodiment.

First, the substrate processing apparatus and the substrate carrier according to the present embodiment will be explained.

The substrate processing apparatus according to the present embodiment includes a plurality of processing baths including a processing bath 20 for holding a chemical for processing substrates 12 and a processing bath 22 for holding pure water. Above the processing baths there is disposed a carrier robot 24 which carries a substrate carrier 10 which holds the substrates 12. The carrier robot 24 has arms 26 which grip the substrate carrier 12 (FIG. 14A). The carrier robot 24 has a lift mechanism (not shown) which lowers and lifts the carrier robot 24 to lower and lift the substrate carrier 12 gripped by the arms 26 into and out of the processing baths.

The substrate carrier 10 comprises a commercially available substrate carrier and a holding jig 38 attached to the substrate carrier. As shown in FIGS. 13A and 13B, the holding jig 38 is attached to ridges 14 of the substrate carrier 10. The holding jig 38 is rested on a support 36 to support the substrate carrier 10 when the substrate carrier 10 is placed in a processing bath 34 so that the carrier substrate 10 does not sink to the bottom of the processing bath 34.

As shown in FIG. 13C, the arms 26 have a swing opening/closing mechanism (not shown). The arms 26 have respective holding portions 39 which are in contact with each other to define a box-shaped space between the arms 26. This space has a size which is enough to accommodate the substrate carrier 10 therein.

Then, the substrate processing method according to the present embodiment will be explained.

Substrates 12 to be processed are held in the substrate carrier 10. Then, the substrate carrier 10 is gripped by the arms 26 to be carried to above the chemical processing bath 20. The held substrate carrier 10 is housed in the space defined by the left and right holding portions 39 and supported by the holding jig 38 attached to the upper part of the substrate carrier 10.

When the substrate carrier 10 is moved to above the chemical processing bath 20, the carrier robot 24 is lowered by a lift mechanism thereof to lower the arms 26 and immerse the substrate carrier 10 into the chemical. When the holding jig 38 arrives at the support 36 disposed near the chemical processing bath 20, the substrate carrier 10 which has been held by the arms 26, is rested on the support 36 and does not sink any deeper into the chemical processing bath 20.

When the substrate carrier 10 is rested on the support 36, the arms 26 are opened to leave the substrate carrier in the chemical processing bath, and the carrier robot 24 is lifted by the lift mechanism to lift the arms. In this state the chemical processing is performed.

When the chemical processing is over, the carrier robot 24 is again lowered by the lift mechanism to lower the arms 26 to hold the substrate carrier 10 at the holding portions 39 thereof. That is, the substrate carrier 10 is sunk with the arms 26 opened down to a position where the substrate carrier 10 is accommodated in the space defined by the holding portions 39, and the arms 26 are completely closed. In this state, the carrier robot 24 is lifted by the lift mechanism to lift the arms 26, and the substrate carrier 10 accommodated in the space defined by the holding portions 39 is taken out of the chemical processing bath 20.

The space defined by the holding portions 39 of the left and the right arms 26 is a box-shaped container. The chemical is held in the space even after the substrate carrier 10 has been taken out of the chemical processing bath 20. The substrate carrier 10 is moved by the carrier robot 24 to above the water processing bath 22 while accommodated in the space defined by the holding portions 39.

The holding portions of the left and the right arms 26 do not perfectly close tightly to each other. Some of the chemical leaks out of the substrate carrier 10. As in the first embodiment, an inter-processing bath substrate carrier carrying time is so short that the substrate carrier 10 can be carried to the water processing bath before the upper portions of the substrates 12 reach the liquid surface (FIGS. 14A (front view) and 14C (side view)).

Then, as the substrate carrier 10 was immersed into the chemical, the carrier robot 24 is lowered by the lift mechanism to lower the arms 26 to immerse the substrate carrier 10 into the pure water. When the substrate carrier 10 is rested on the support 36, the arms 26 are opened to leave the substrate carrier in the water processing bath 22, and the carrier robot 24 is lifted by the lift mechanism to lift the arms with the substrate carrier 24 left in the water processing bath 22. In this state the water rinse is conducted for a prescribed period of time.

When the substrate carrier is placed in the water processing bath 22, the chemical in the substrate carrier 10 mixes into the pure water in the water processing bath 22. Overflow rinse with pure water is conducted in the water processing bath 22. The water rinse is performed while the mixed chemical is being replaced with the pure water (FIG. 14B).

When the water rinse is over, the carrier robot 24 is lowered by the lift mechanism to lower the arms 26, and the arms 26 grip the substrate carrier 10 in the space defined by the holding portions 39. In this state, the carrier robot 24 is lifted by the lift mechanism to lift the arms 26, and the substrate carrier 10 is taken out of the water processing bath 22 while accommodated in the space defined by the holding portions 39.

When the water rinse is followed by another chemical processing, the arms 26 are lifted with the substrate carrier 10 immersed in the pure water in the space defined by the holding portions 39, and is moved to another processing bath of another chemical. The above-described procedure is again conducted.

When the substrate processing is finished, the substrate carrier 10 is carried by the carrier robot 24 sequentially to a neighboring alcohol processing bath (not shown) and to a warm air drying vessel (not shown) to dry the substrates. A line of processing is over.

This substrate processing enables substrates to be subjected to chemical processing without contacting the substrates with the gas-liquid interfaces.

The above-described substrate processing is not applicable to chemical processing with chemicals, such as sulfuric acid, which are highly reactive with water.

The substrate processing method using a chemical which is highly reactive with water will be explained with reference to FIGS. 15A to 15C.

First, substrates 12 to be processed are held in the substrate carrier 10. Then, the substrate carrier 10 is gripped by the arms 26 and carried by the carrier robot 24. The gripped substrate carrier 10 is accommodated in the space defined by the holding portions 39 of the left and the right arms, supported by the holding jig 38 attached to the upper part of the substrate carrier 10.

When the substrate carrier 10 is carried to above the chemical processing bath 20, the carrier robot 24 gripping the substrate carrier 10 by the arms 26 is lowered by the lift mechanism to immerse the substrate carrier 10 into a chemical in the processing bath 20. When the holding jig 38 attached to the substrate carrier 20 arrives at the support 36 disposed near the chemical processing bath 20, the substrate carrier 10 which has been gripped by the arms 26 are rested on the support 36 and does not sink any deeper into the chemical processing bath 20.

When the substrate carrier 10 is rested on the support 36, the arms 26 are opened to leave the substrate carrier in the chemical processing bath 20, and the carrier robot 24 is lifted by the lift mechanism to lift the arms 26, leaving the substrate carrier in the chemical processing bath 20. In this state, the chemical processing is conducted for a prescribed period of time.

When the chemical processing is over, the carrier robot is again lowered by the lift mechanism to lower the arms 26, and the arms 26 grip the substrate carrier 10 in the space defined by the holding portions 39. That is, the opened arms 26 are lowered into the chemical processing bath down to a position where the substrate carrier 10 is accommodated in the space defined by the holding portions 39 of the arms 26 when the arms 26 are closed. Then the arms 26 are closed. At this time the arms 26 are adjusted so as not to perfectly close tightly with each other.

Figures 15A, 15B:
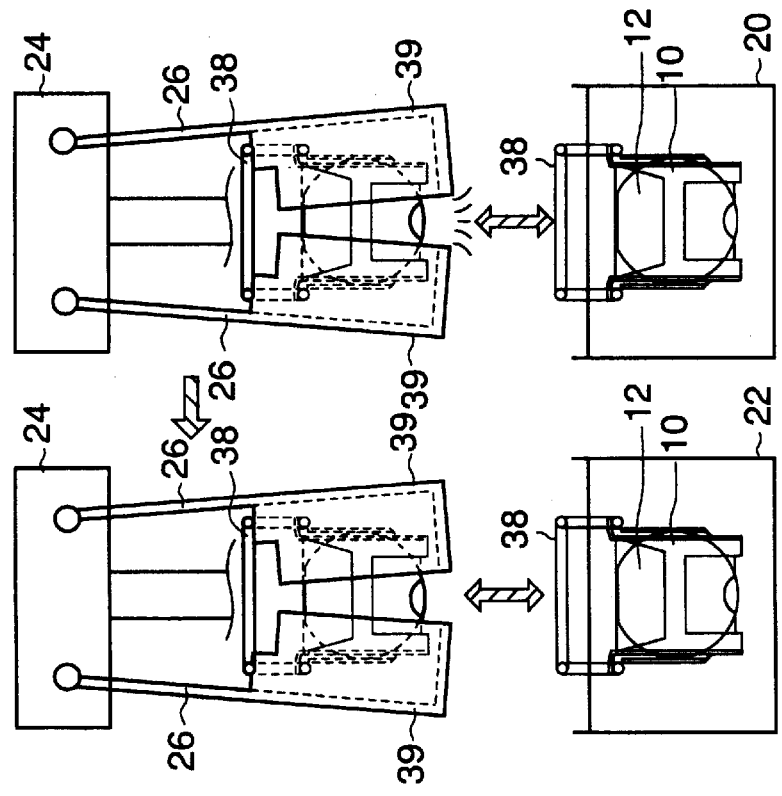
FIGS. 15A to 15C are explanatory views (part 2) of the substrate processing method and apparatus according to the fifth embodiment of the present invention.
Figure 15C:
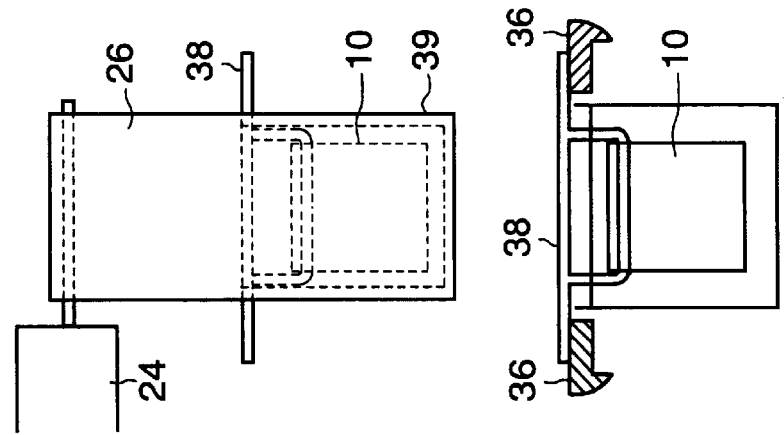
Figure 16:
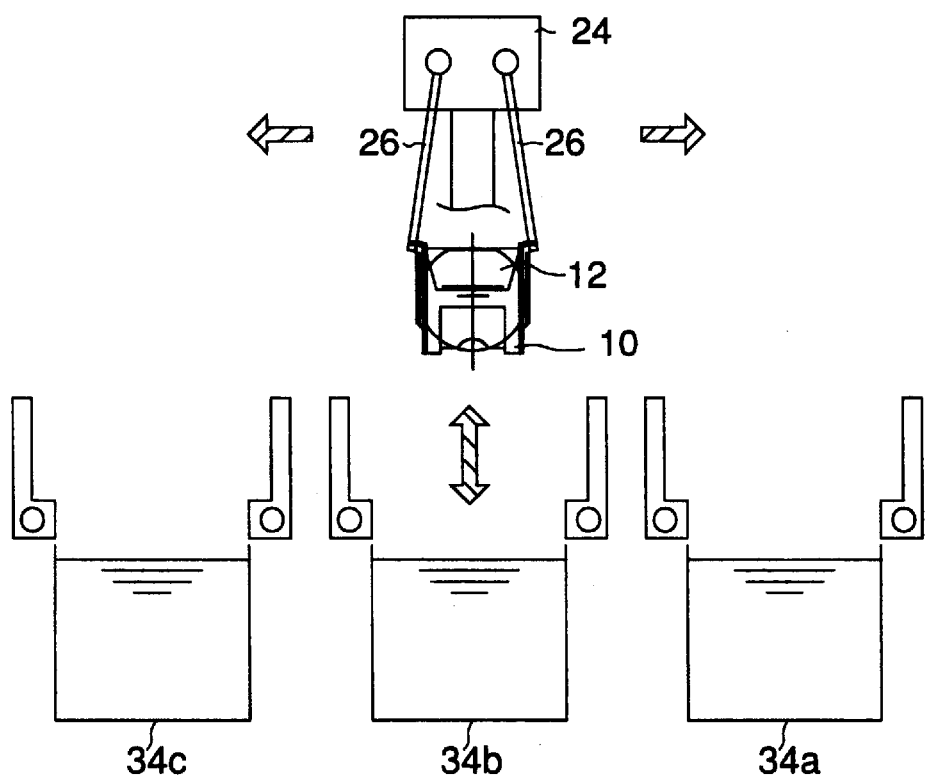
FIG. 16 is an explanatory view of a conventional substrate processing method and apparatus.
Figure 17A:
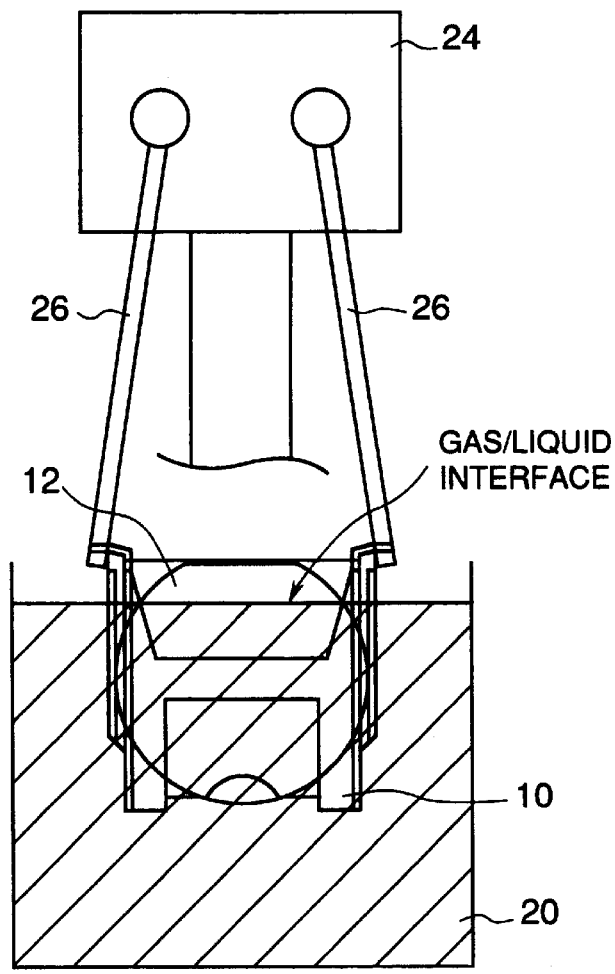
FIGS. 17A and 17B are explanatory views of problems of the substrate processing apparatus of FIG. 15.
Figure 17B:
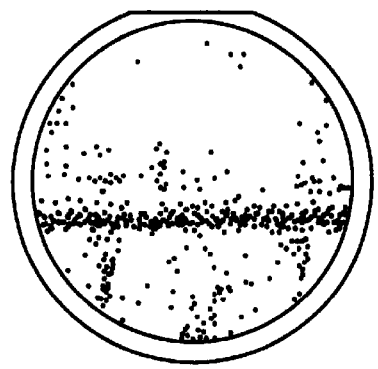

When the carrier robot 24 is lifted by the lift mechanism to lift the arms 26, and the substrate carrier 10 is lifted by the arms 26 out of the chemical processing bath 20, the chemical in the space defined by the holding portions 39 which are not perfectly contacted with each other is discharged out of the space therebetween (FIGS. 15A and 15B).

After the substrate carrier 10 is carried by the carrier robot 24 to above the water processing bath 22, the arms 26 are lowered to immerse the substrate carrier 10 into the pure water, and water rinse is conducted. At this time, the chemical in the arms 26 has been almost discharged, and does not vigorously react with the water (FIG. 15B).

When another chemical processing follows the water rinse, the arms 26 are operated in accordance with the chemical. In a case, for example, that the chemical is highly reactive with water, the arms 26 are operated not to tightly close the space, and the substrate carrier 10 is moved after the pure water therein has been discharged. In a case that the chemical is not a highly reactive with water, the arms 26 are operated so that the substrate carrier 10 can be moved to another processing bath of a chemical with the pure water held therein, and the above-described procedure is conducted.

When the substrate processing is over, the substrate carrier 10 is carried by the carrier robot 24 to a neighboring alcohol bath (not shown) and to a warm air drying vessel (not shown) to dry the substrates. A line of processing is completed.

The substrate processing in this manner enables the substrate processing apparatus to be used also for the substrate processing with chemicals which are highly reactive with water.

According to the present embodiment, the arms which grip the substrate carrier are arranged so as to define a box-shaped space inside when the arms are closed. When the substrate carrier is moved, the substrate carrier is accommodated together with some of the chemical when the substrate carrier is moved. In a line of processing, the substrates do not contact gas-liquid interfaces, and adhesion of particles can be reduced to be equal to that of the single bath processing apparatus.

The arms used in the fifth embodiment can only define a space for a processing liquid to be held in when the two arms are in contact with each other. The arms are not limited to the shape used in the fifth embodiment.

What is claimed is:

1. A substrate processing method for immersing a substrate in a plurality of processing baths which are filled respectively with chemicals or pure water to subject the substrate to chemical processing and water rinse, such that
   when a substrate carrier for holding the substrate is moved from a first one of the processing baths to a second one of the processing baths, the substrate carrier is moved to the second processing bath with a chemical or pure water from the first processing bath held in the substrate carrier.

2. A substrate processing method comprising:
   a first substrate processing step of immersing a substrate carrier holding substrate to be processed into a first processing liquid filling a first processing bath and processing the substrate;
   a substrate carrier moving step of moving the substrate carrier to a second processing bath filled with a second processing liquid with the first processing liquid held in the substrate carrier; and,
   a second substrate processing step of immersing the substrate carrier with the first processing liquid held therein into the second processing liquid in the second processing bath, replacing the first processing liquid in the substrate carrier with the second processing liquid, and processing the substrate with the second processing liquid.

3. A substrate processing method according to claim 1, wherein
when the substrate carrier is moved, the substrate carrier is held by arms with openings formed in the substrate carrier closed thereby.

4. A substrate processing method according to claim 2, wherein
when the substrate carrier is moved, the substrate carrier is held by arms with openings formed in the substrate carrier closed thereby.

5. A substrate processing method according to claim 1, wherein
the substrate carrier is accommodated in a box-shaped space defined by arms for holding the substrate carrier, and is moved with the chemical or pure water held in the box-shaped space.

6. A substrate processing method according to claim 2, wherein
the substrate carrier is accommodated in a box-shaped space defined by arms for holding the substrate carrier, and is moved with the chemical or pure water held in the box-shaped space.

7. A substrate processing method using a substrate processing apparatus which comprises substrate carrier which has openings, for holding a substrate, and arms for holding and moving the substrate carrier, the substrate processing method comprising:
a substrate immersing step of immersing the substrate in the substrate carrier into a chemical or pure water filling a first processing bath;
a substrate carrier lifting step of lifting the substrate carrier out of the first processing bath by the arms with the openings closed thereby when the substrate is moved while being immersed in the chemical or pure water; or lifting the substrate carrier out of the first processing bath by the arms with the openings not entirely closed or opened when the substrate is moved with the chemical or the pure water in the substrate carrier being discharged; and,
a substrate carrier moving step of moving the substrate carrier to a second processing bath by the arms.

8. A substrate processing method according to claim 7, wherein
the substrate carrier includes the openings, first holding means, and second holding means, formed in sidewalls thereof;
when the substrate is moved while being immersed in the chemical or the pure water, the second holding means are held by the arms with the openings closed thereby, and the substrate carrier is lifted out of the first processing bath;
when the substrate is moved with the chemical or the pure water in the substrate carrier being discharged, the first holding means are held by the arms with the openings opened, and the substrate carrier is lifted out of the first processing bath.

9. A substrate processing method according to claim 7, wherein
the substrate carrier includes the openings, first holding means, and second holding means, formed in sidewalls thereof;

the arms includes holding portions engaged with the first holding means or second holding means;
when the substrate is moved while being immersed in the chemical or the pure water, the second holding means are engaged with the holding portions with the openings closed thereby, and the substrate carrier is lifted out of the first processing bath;
when the substrate is moved with the chemical or the pure water in the substrate carrier being discharged, the first holding means are engaged with the holding portions with the openings not entirely closed or opened, and the substrate carrier is lifted out of the first processing bath.

10. A substrate processing method according to claim 7, wherein
the substrate carrier includes the openings formed in a bottom surface thereof;
when the substrate is moved while being immersed in the chemical or the pure water, the bottom of the substrate carrier is held by the arms with the openings closed thereby, and the substrate carrier is lifted out of the first processing bath;
when the substrate is moved with the chemical or the pure water in the substrate carrier being discharged, the bottom of the substrate carrier is held by the arms with the openings not entirely closed thereby, and the substrate carrier is lifted out of the first processing bath.

11. A substrate processing method according to claim 7, wherein
the arms includes first arms which hold and move the substrate carrier, and second arms which close the openings of the substrate carrier;
when the substrate is moved while being immersed in the chemical or the pure water, the substrate carrier is held by the first arms and the openings are closed by the second arms, and the substrate carrier is lifted out of the first processing bath;
when the substrate is moved with the chemical or the pure water in the substrate carrier being discharged, the substrate carrier is held by the first arms and the openings are not closed by the second arms, and the substrate carrier is lifted out of the first processing bath.

12. A substrate processing method, using a substrate processing apparatus which comprises a substrate carrier which has openings, for holding a substrate, and arms having holding portions for holding the substrate carrier therein, the substrate processing method comprising:
a first substrate immersing step of immersing the substrate in the substrate carrier into a chemical or pure water filling a first processing bath;
a substrate carrier lifting step of holding the substrate carrier so that the holding portions define a space, and the substrate carrier is held in the space, and lifting the substrate carrier out of the first processing bath, when the substrate is moved while being immersed in the chemical or pure water; or holding the substrate carrier so that the space is defined by the holding portions with a gap therebetween, and the substrate carrier is held in the space, and lifting the substrate carrier out of the first processing bath, when the substrate is moved with the chemical or the pure water in the substrate carrier being discharged; and,
a substrate carrier moving step of moving the substrate carrier to a second processing bath by the arms.

* * * * *